(12) United States Patent
Schulze et al.

(10) Patent No.: US 9,847,229 B2
(45) Date of Patent: Dec. 19, 2017

(54) METHOD FOR FORMING A SEMICONDUCTOR DEVICE AND SEMICONDUCTOR DEVICE

(71) Applicant: Infineon Technologies AG, Neubiberg (DE)

(72) Inventors: Hans-Joachim Schulze, Taufkirchen (DE); Johannes Laven, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/706,435

(22) Filed: May 7, 2015

(65) Prior Publication Data

US 2015/0325440 A1 Nov. 12, 2015

(30) Foreign Application Priority Data

May 9, 2014 (DE) .................. 10 2014 106 594

(51) Int. Cl.
| | |
|---|---|
| H01L 21/02 | (2006.01) |
| H01L 21/225 | (2006.01) |
| H01L 21/266 | (2006.01) |
| H01L 27/04 | (2006.01) |
| H01L 29/36 | (2006.01) |
| H01L 21/265 | (2006.01) |

(Continued)

(52) U.S. Cl.
CPC ...... *H01L 21/26506* (2013.01); *H01L 21/225* (2013.01); *H01L 21/266* (2013.01); *H01L 27/04* (2013.01); *H01L 29/36* (2013.01); *H01L 29/66348* (2013.01); *H01L 29/7397* (2013.01); *H01L 21/0254* (2013.01); *H01L 21/02378* (2013.01); *H01L 21/02381* (2013.01); *H01L 21/02389* (2013.01); *H01L 21/02395* (2013.01); *H01L 21/02529* (2013.01); *H01L 21/02532* (2013.01); *H01L 21/02546* (2013.01); *H01L 21/02658* (2013.01); *H01L 21/02664* (2013.01); *H01L 29/861* (2013.01)

(58) Field of Classification Search
None
See application file for complete search history.

(56) References Cited

U.S. PATENT DOCUMENTS

| | | | |
|---|---|---|---|
| 6,689,671 B1 * | 2/2004 | Yu ............ | H01L 21/02381 257/E21.129 |
| 2002/0081824 A1 * | 6/2002 | Dolan .......... | H01L 21/76243 438/480 |

(Continued)

FOREIGN PATENT DOCUMENTS

| | | |
|---|---|---|
| DE | 102011113549 A1 | 3/2013 |
| JP | 61102778 A | 5/1986 |

(Continued)

*Primary Examiner* — Khaja Ahmad
(74) *Attorney, Agent, or Firm* — Murphy, Bilak & Homiller, PLLC

(57) ABSTRACT

A method for forming a semiconductor device includes depositing an epitaxial layer on a semiconductor substrate, forming an oxygen diffusion region within the epitaxial layer by oxygen diffusion from the semiconductor substrate into a part of the epitaxial layer and tempering at least the oxygen diffusion region of the epitaxial layer at a temperature between 400° C. and 480° C. for more than 15 minutes.

21 Claims, 33 Drawing Sheets

(51) Int. Cl.
*H01L 29/66* (2006.01)
*H01L 29/739* (2006.01)
*H01L 29/861* (2006.01)

(56) References Cited

U.S. PATENT DOCUMENTS

| | | | | |
|---|---|---|---|---|
| 2002/0157597 A1* | 10/2002 | Takeno | ............... | H01L 21/3225 117/4 |
| 2006/0185581 A1* | 8/2006 | Aga | ............... | C30B 29/06 117/89 |
| 2010/0151692 A1* | 6/2010 | Ono | ............... | H01L 21/02381 438/758 |
| 2011/0042753 A1* | 2/2011 | Jain | ............... | H01L 21/823807 257/369 |

FOREIGN PATENT DOCUMENTS

| | | | |
|---|---|---|---|
| JP | 01115120 | A | 5/1989 |
| JP | 05308076 | A | 11/1993 |
| JP | 08148501 | A | 6/1996 |
| JP | 09121052 | A | 5/1997 |
| JP | 09260639 | A | 10/1997 |
| JP | 11145146 | A | 5/1999 |
| JP | 2000040822 | A | 2/2000 |
| JP | 2003286094 | A | 10/2003 |
| JP | 2005322712 | A | 11/2005 |
| JP | 2006344977 | A | 12/2006 |
| JP | 2010141272 | A | 6/2010 |
| JP | 201 01 61 237 | A | 7/2010 |
| JP | 2011054618 | A | 3/2011 |
| JP | 2013038101 | A | 2/2013 |
| JP | 2013089858 | A | 5/2013 |
| WO | 2005108656 | A1 | 11/2005 |

* cited by examiner

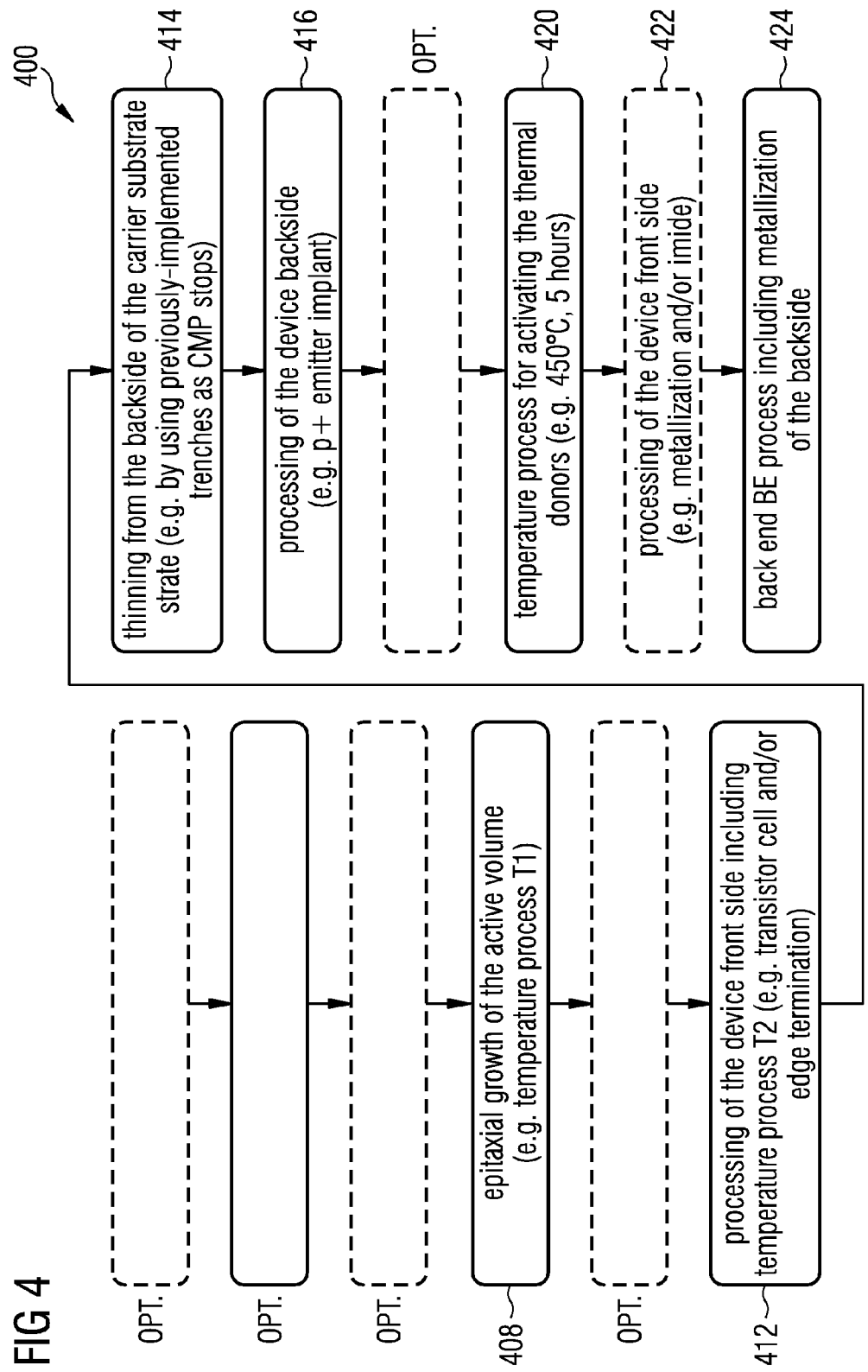

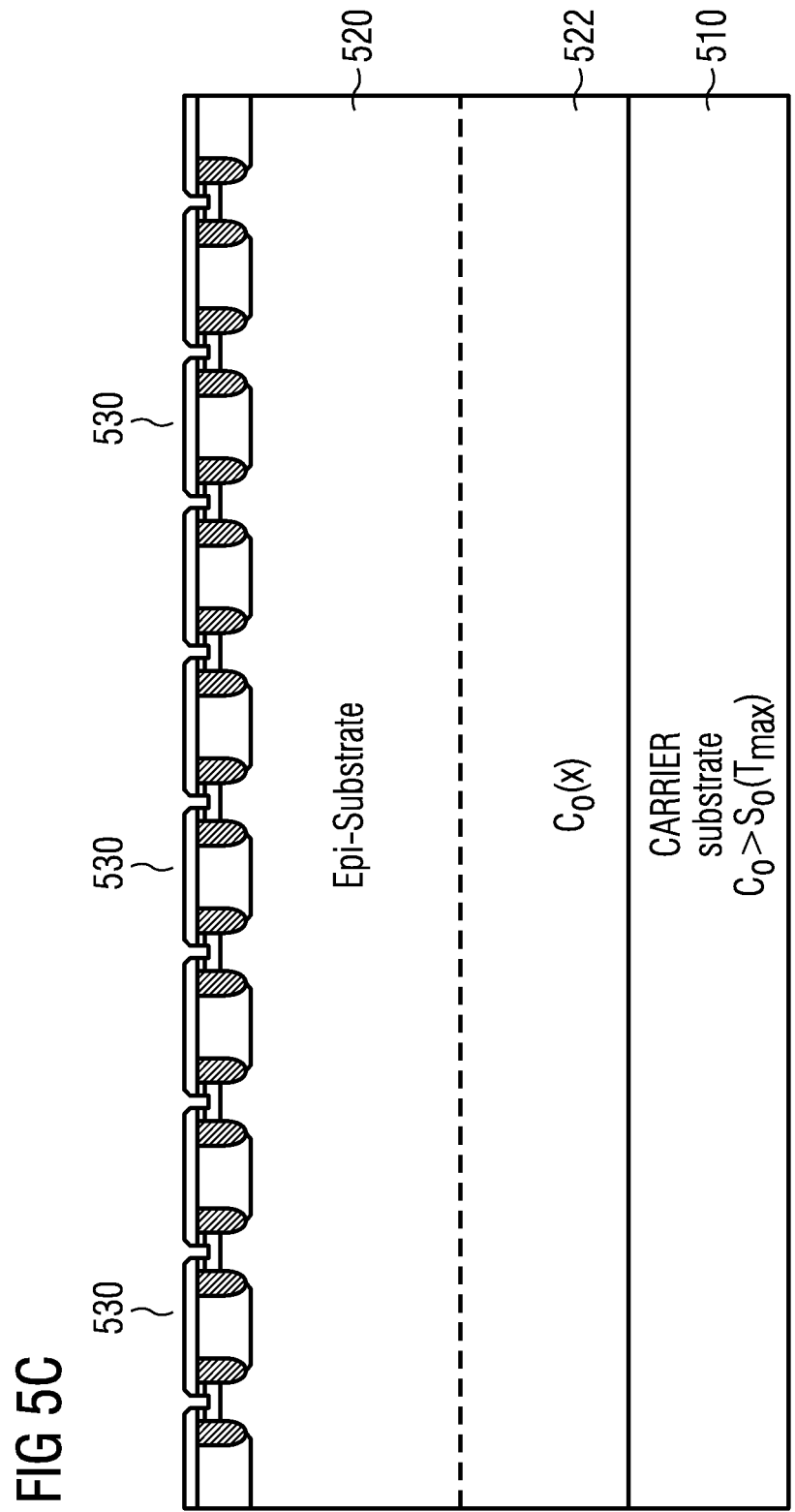

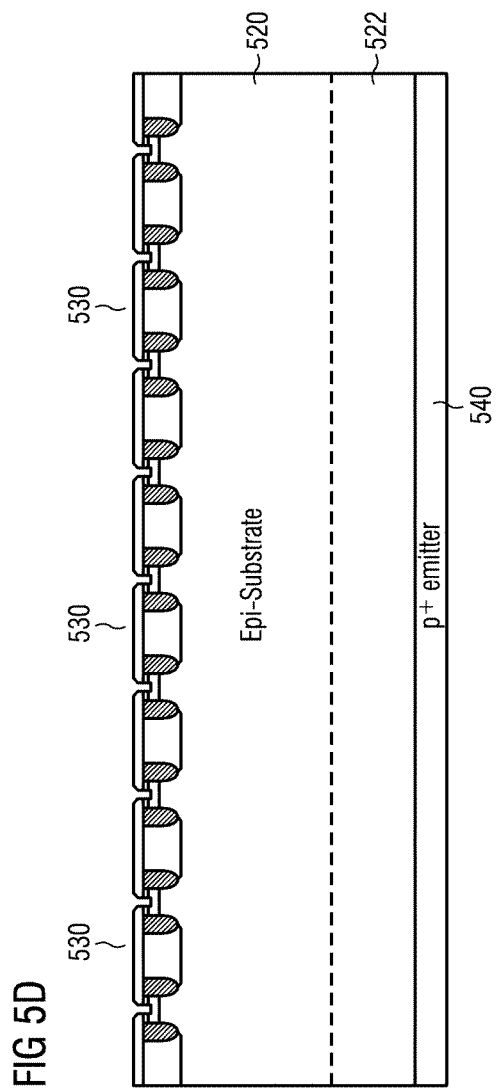

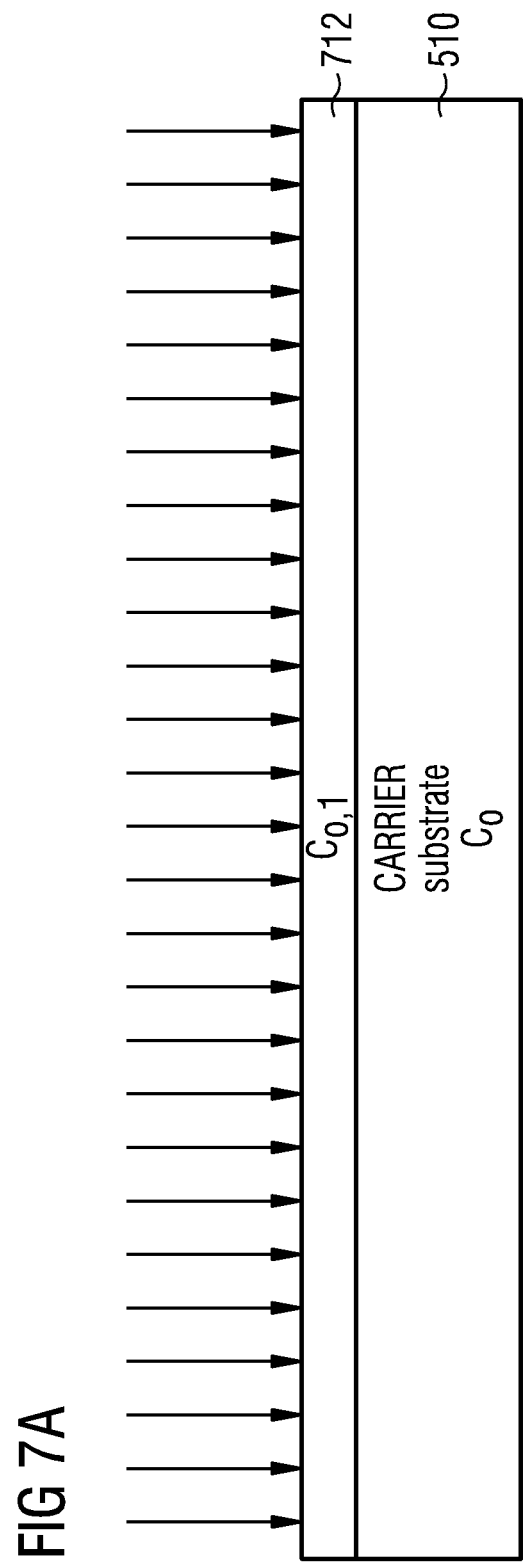

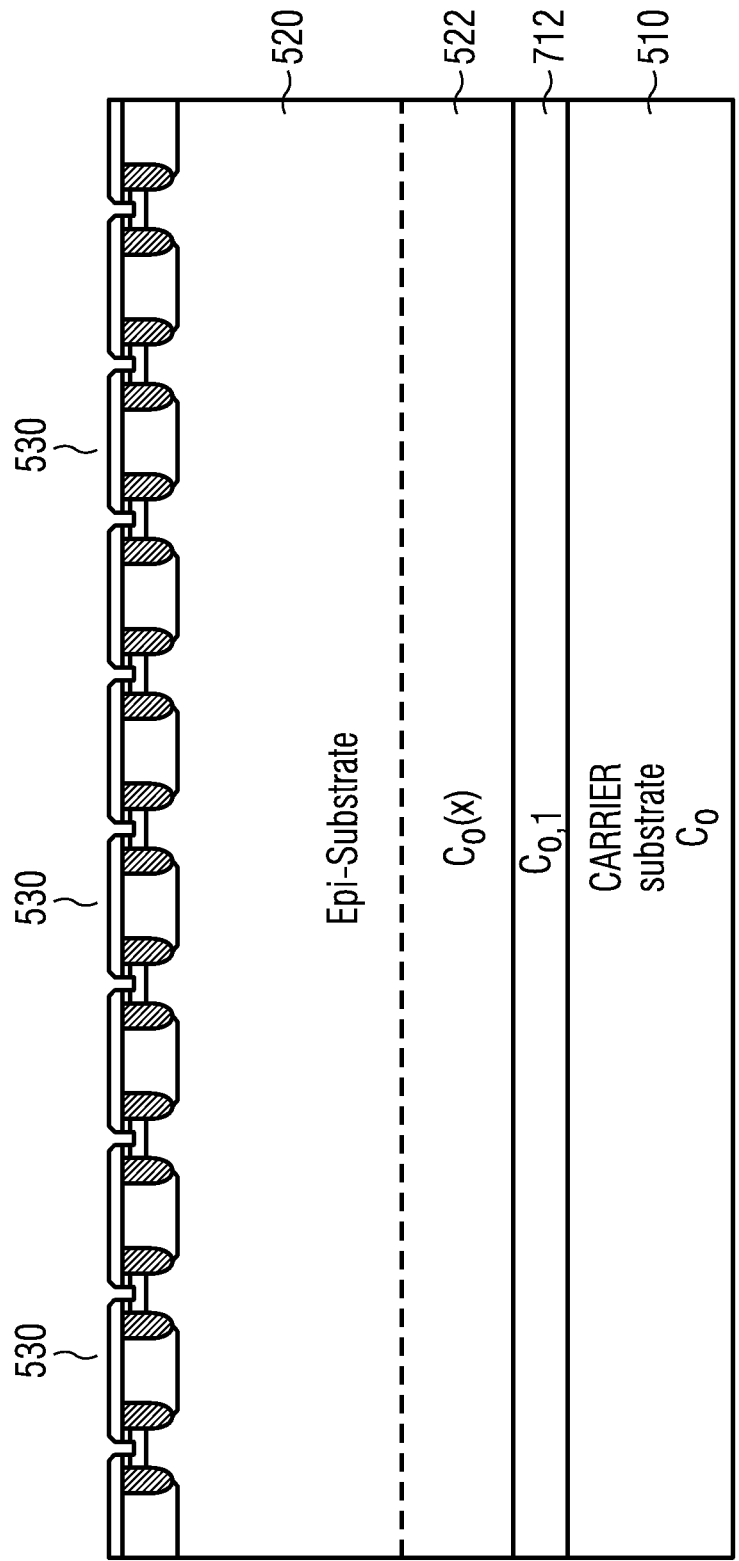

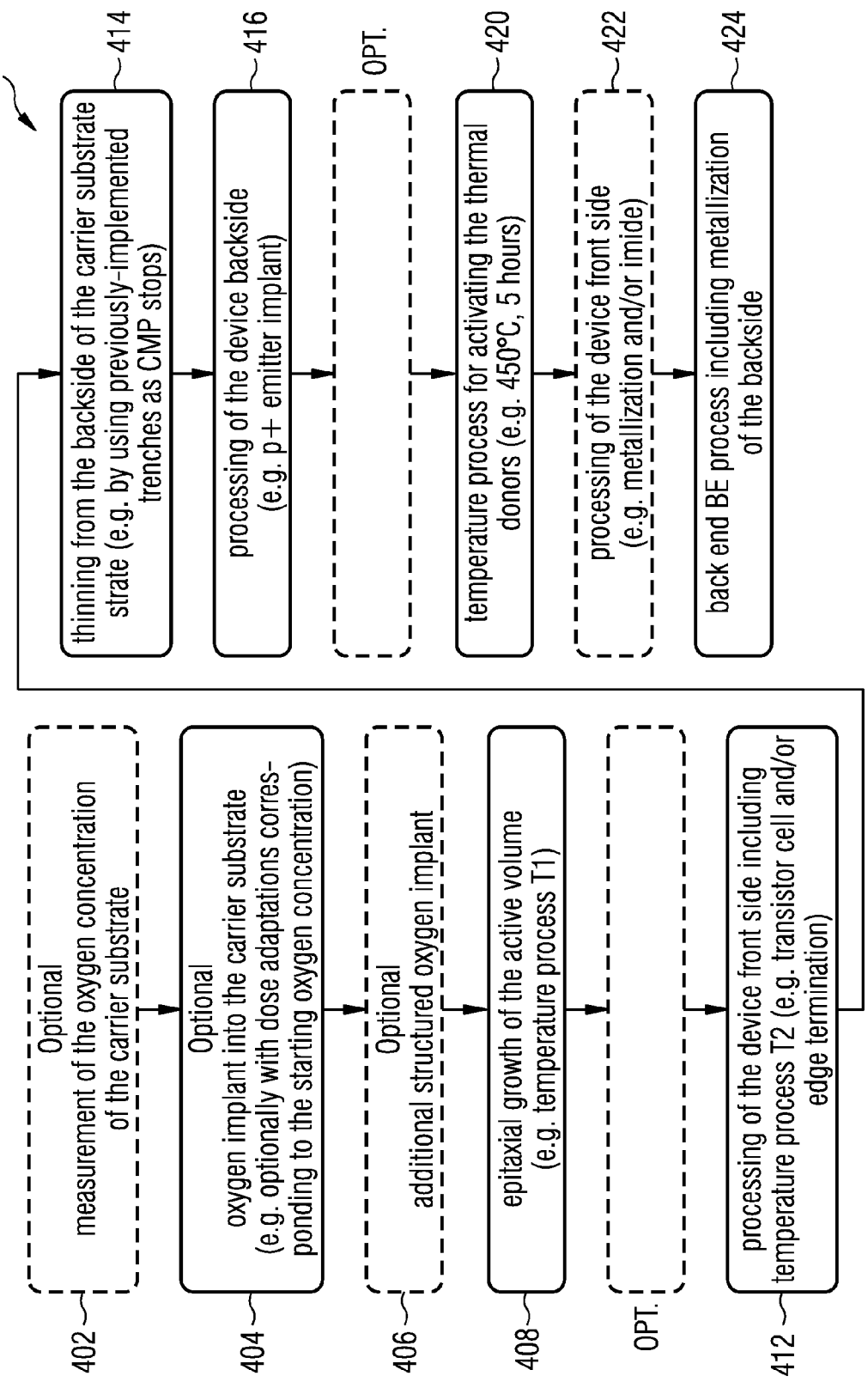

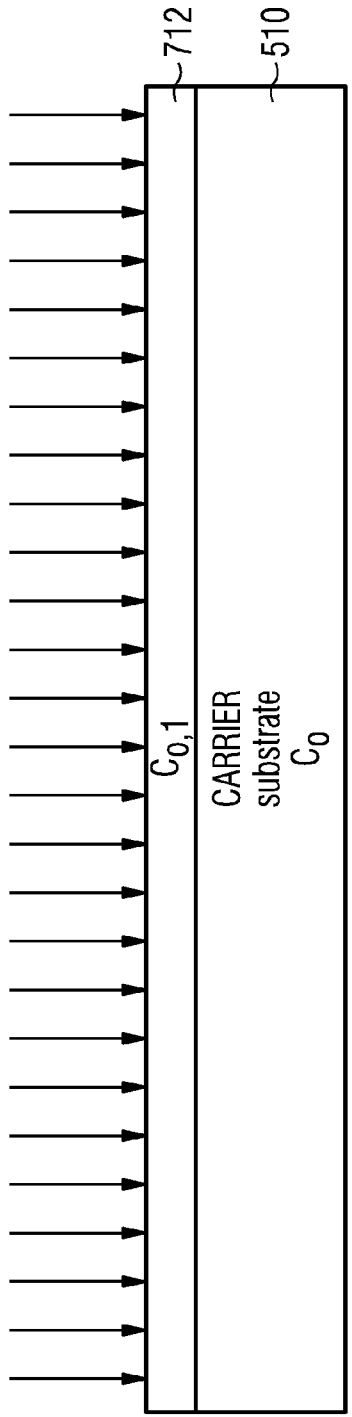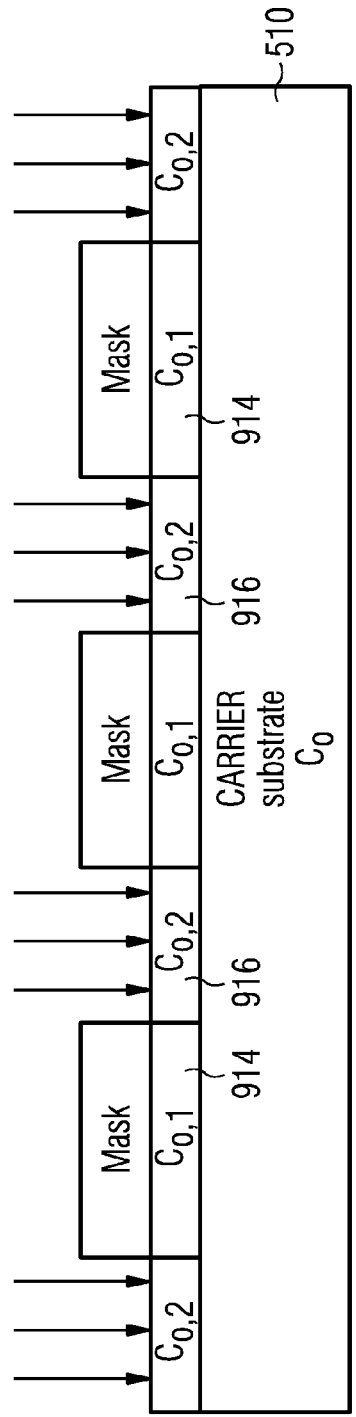

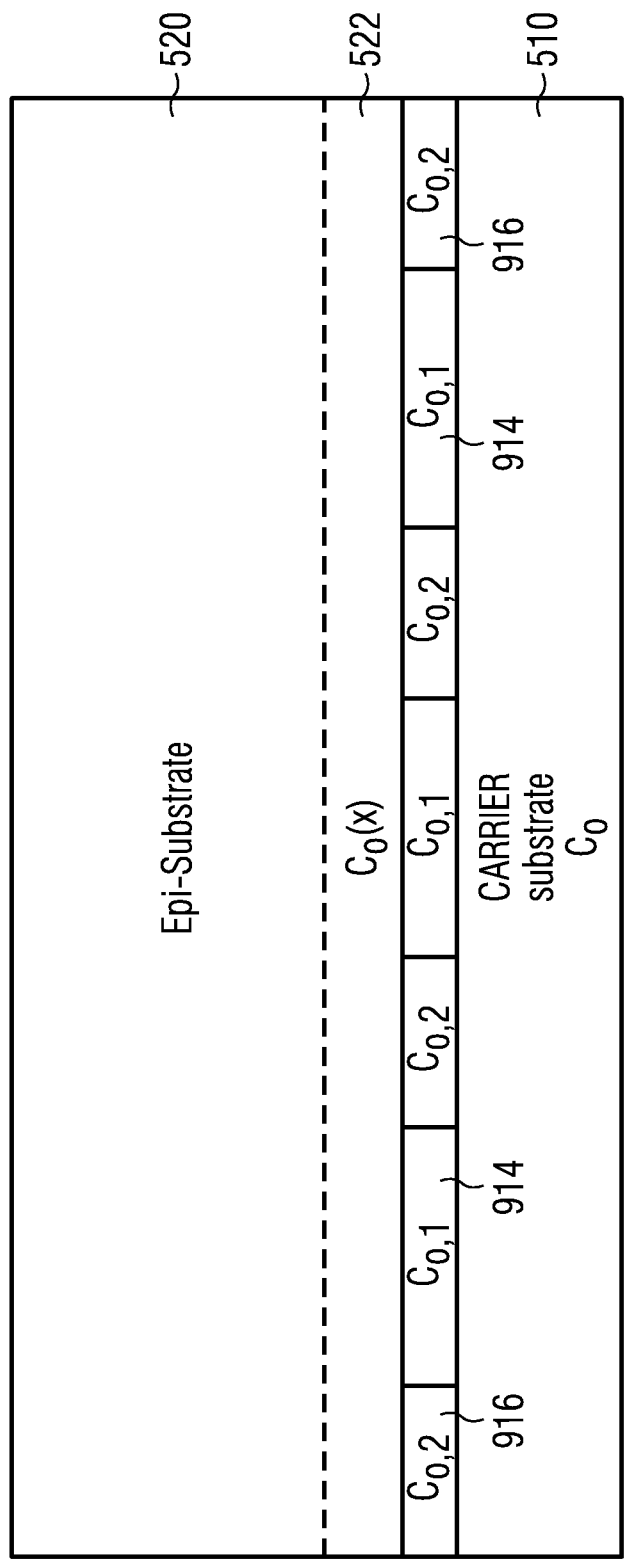

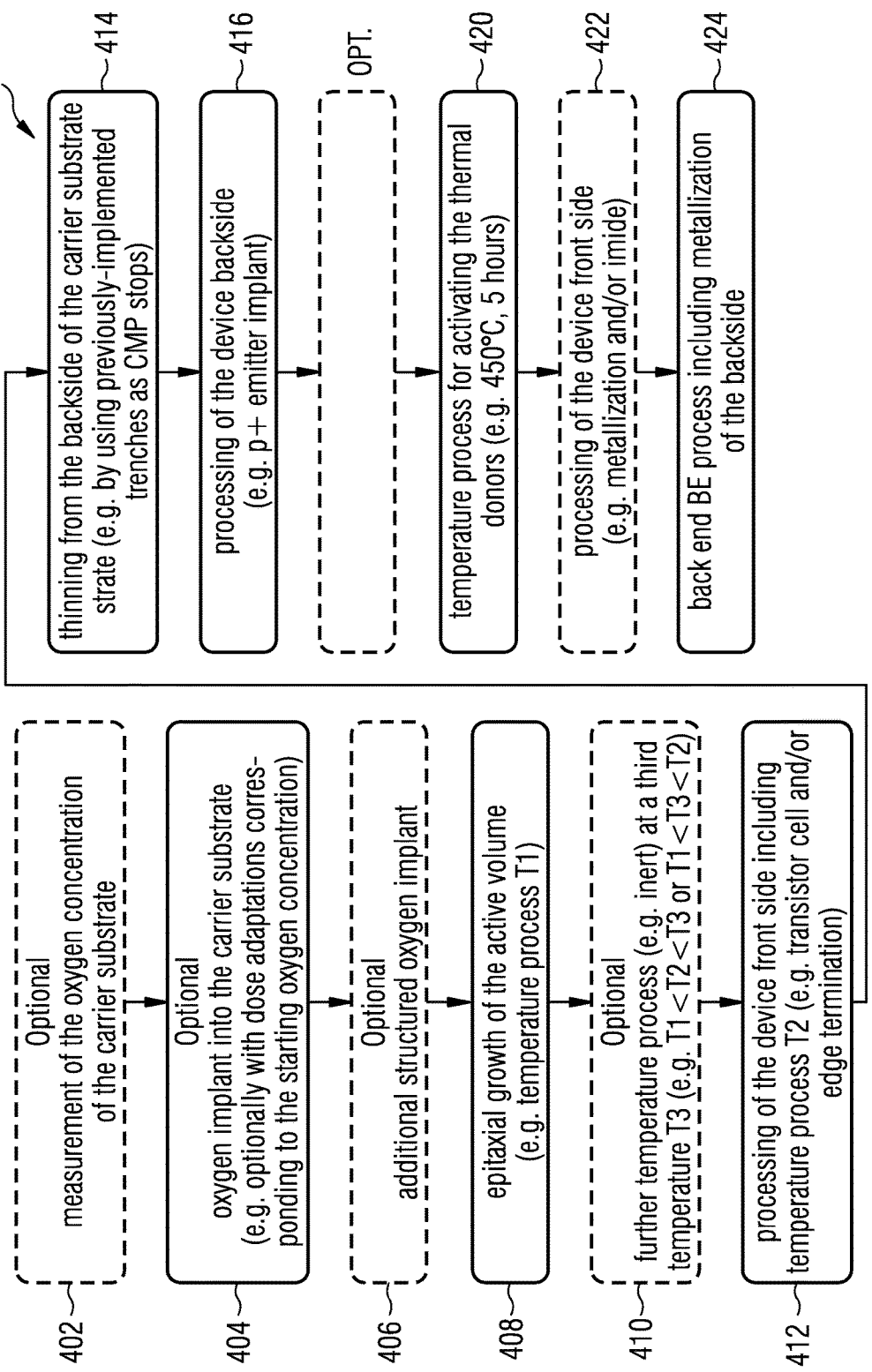

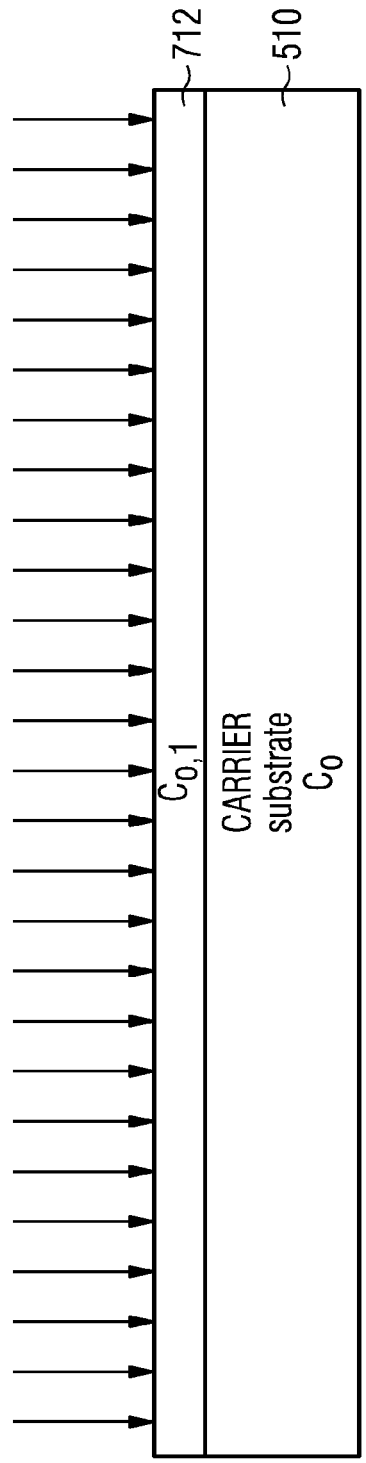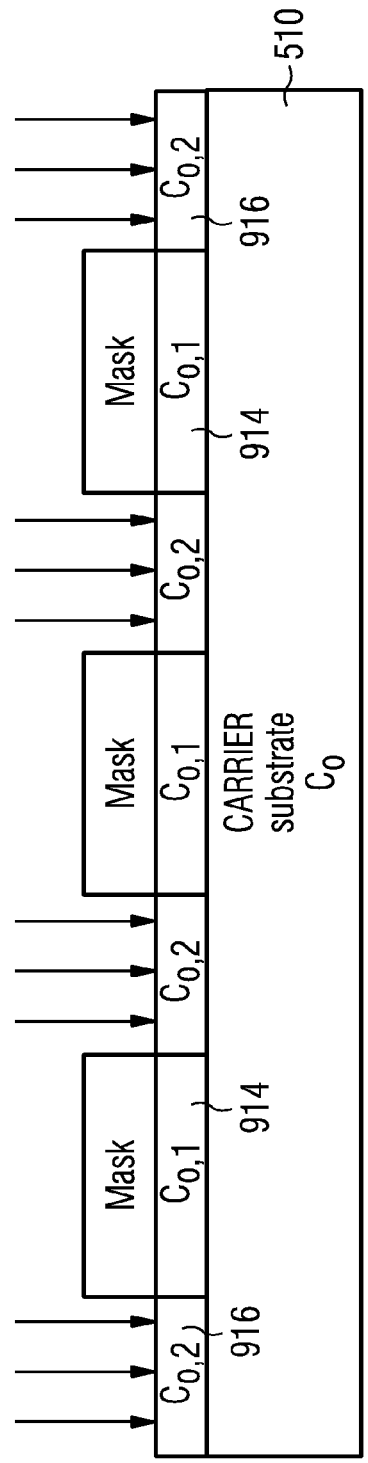

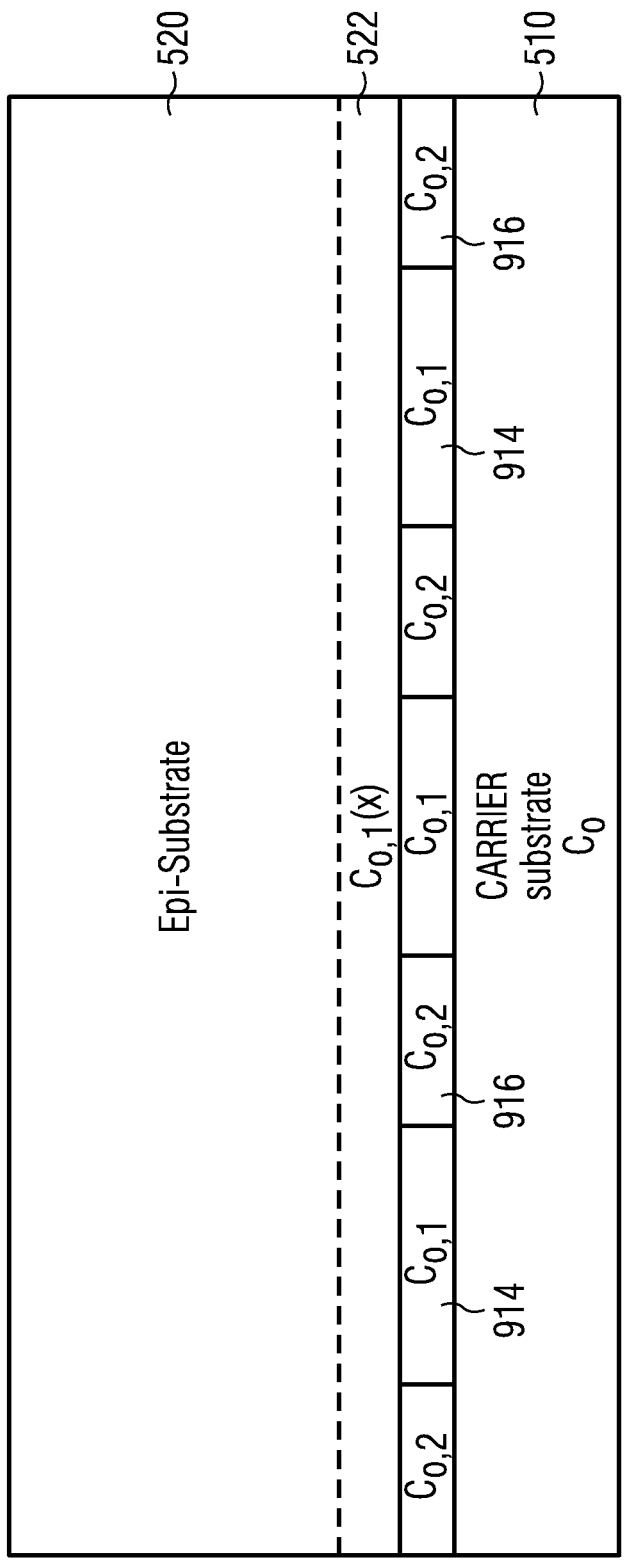

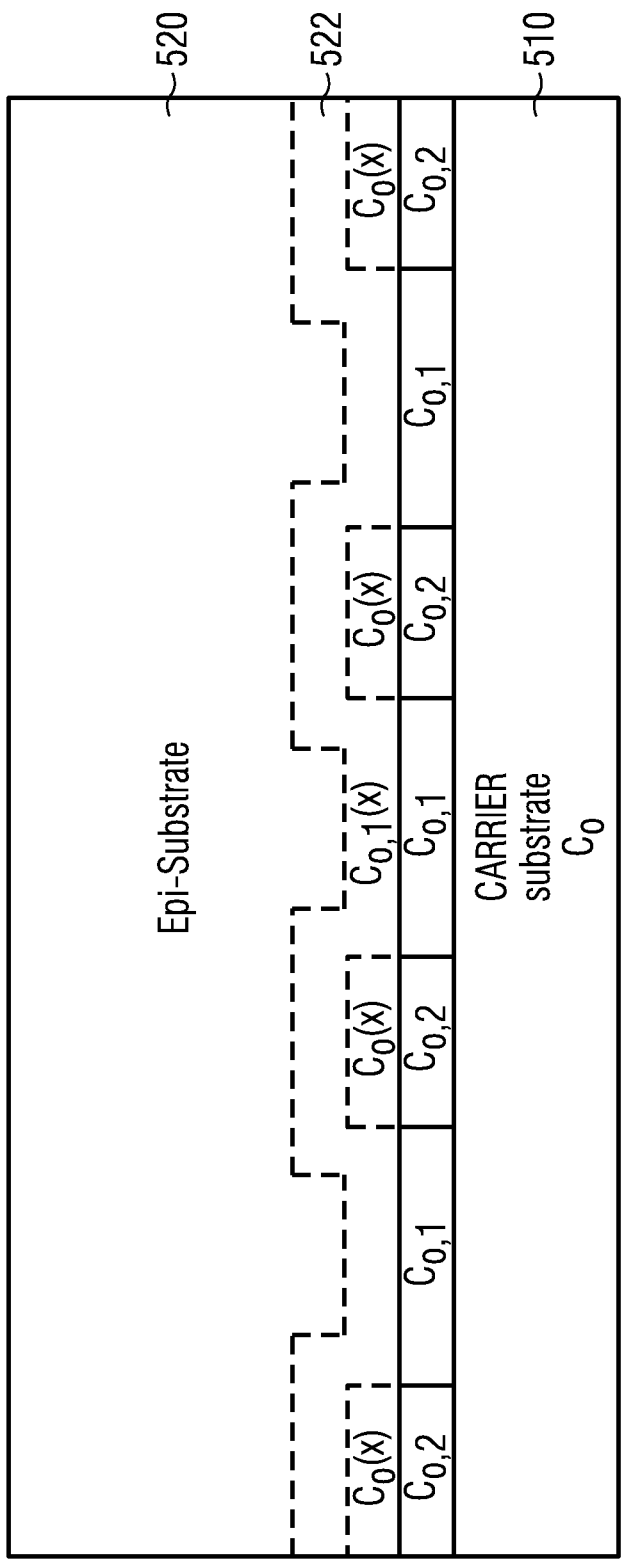

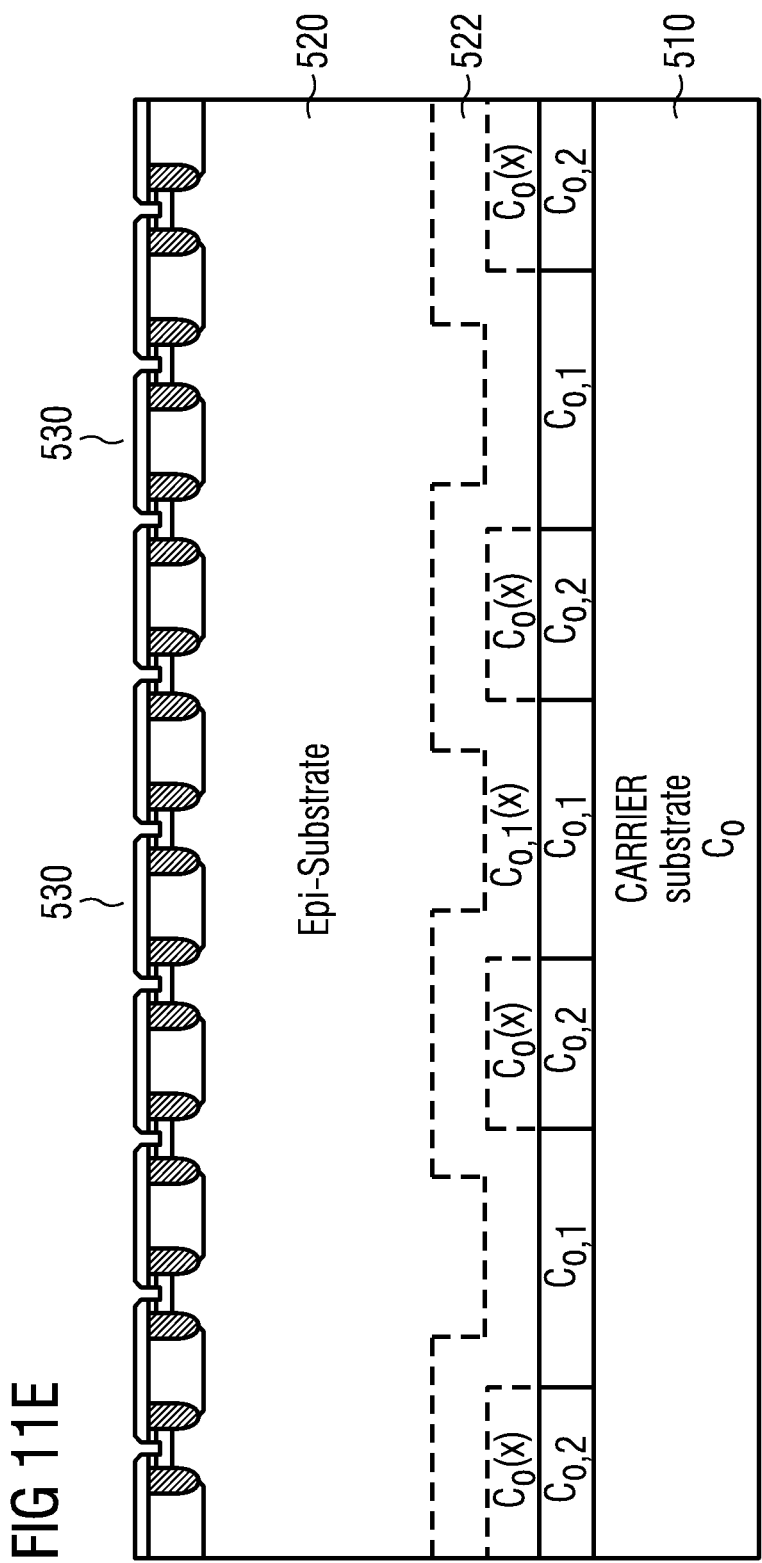

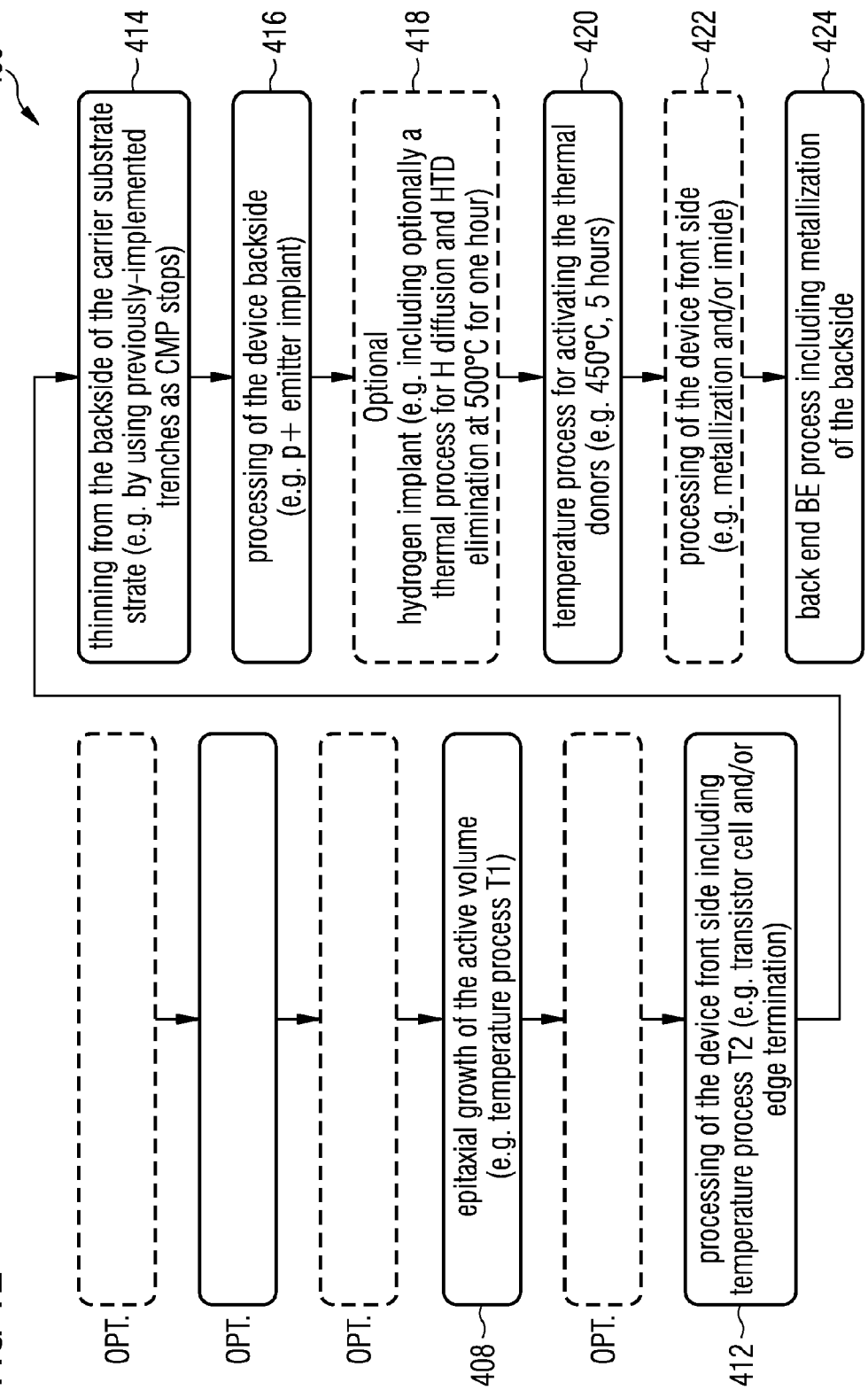

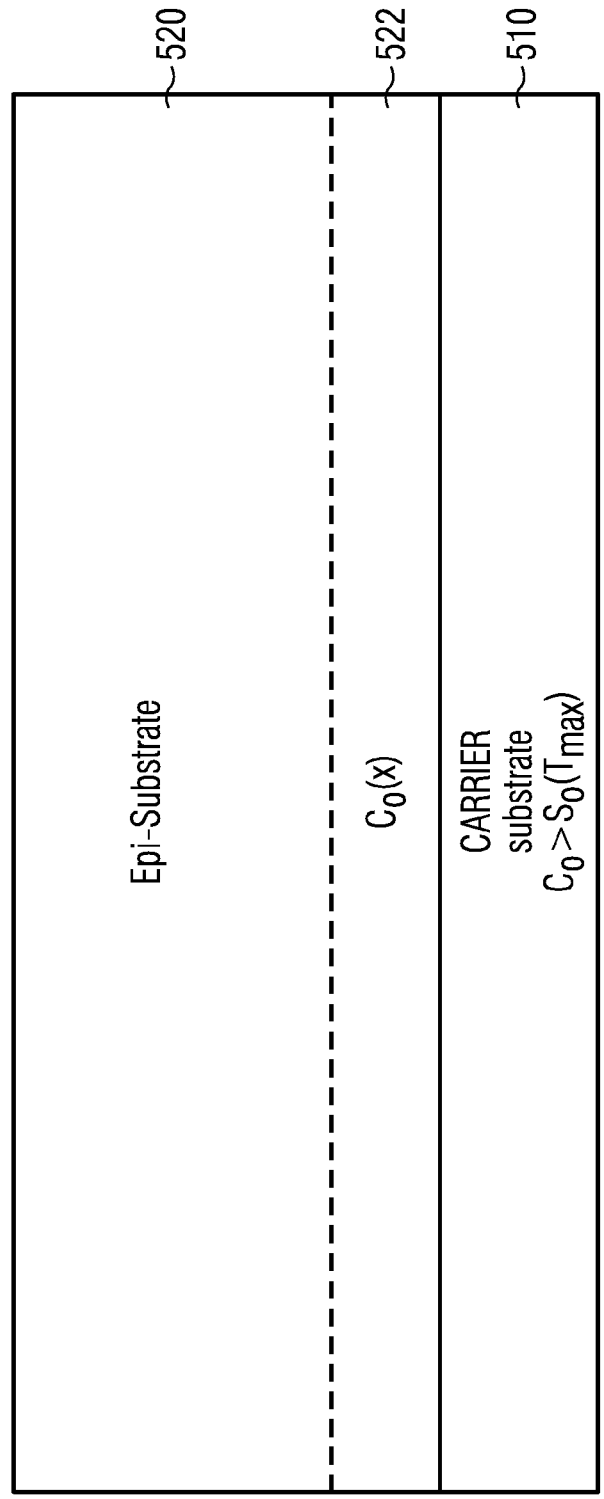
FIG 13A
FIG 13B

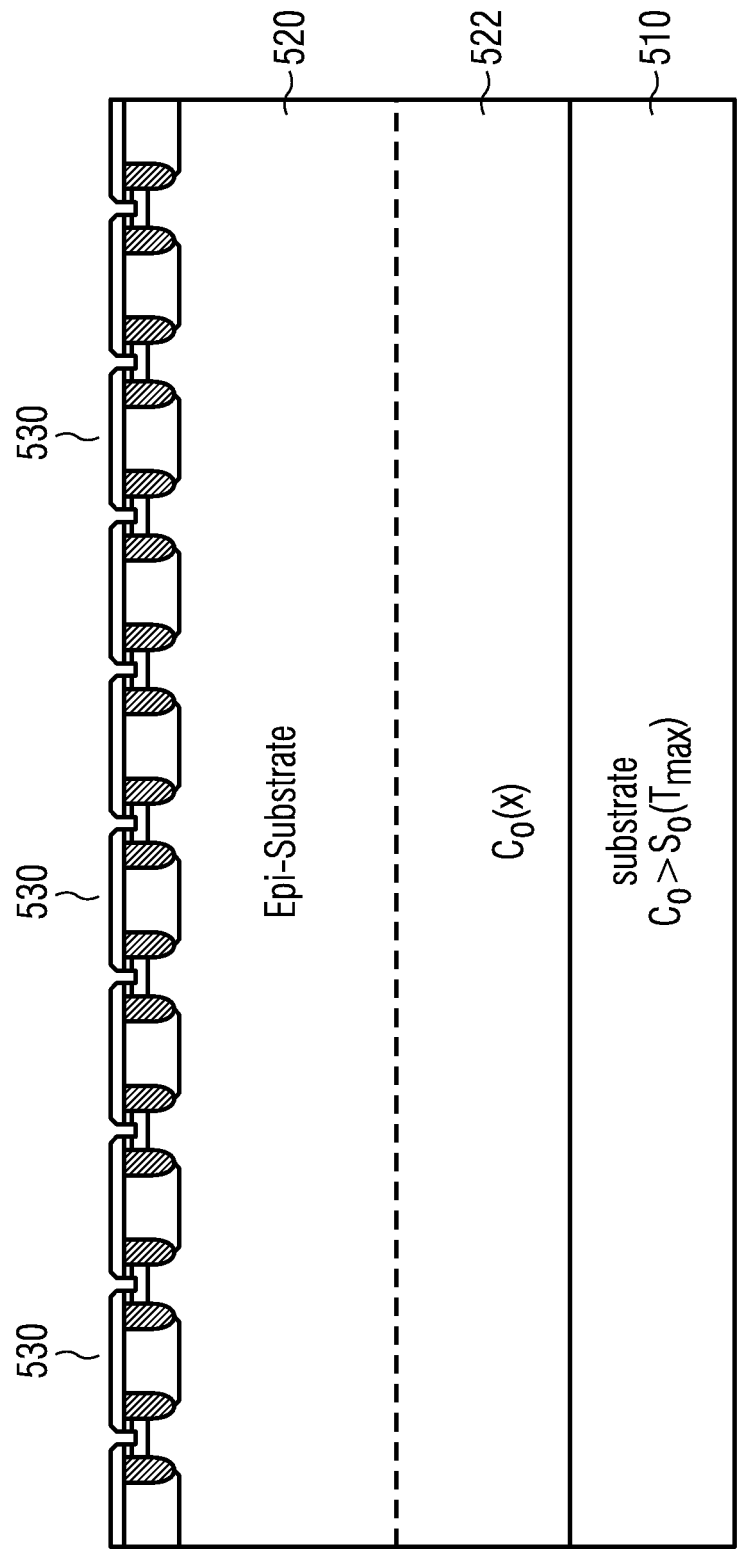

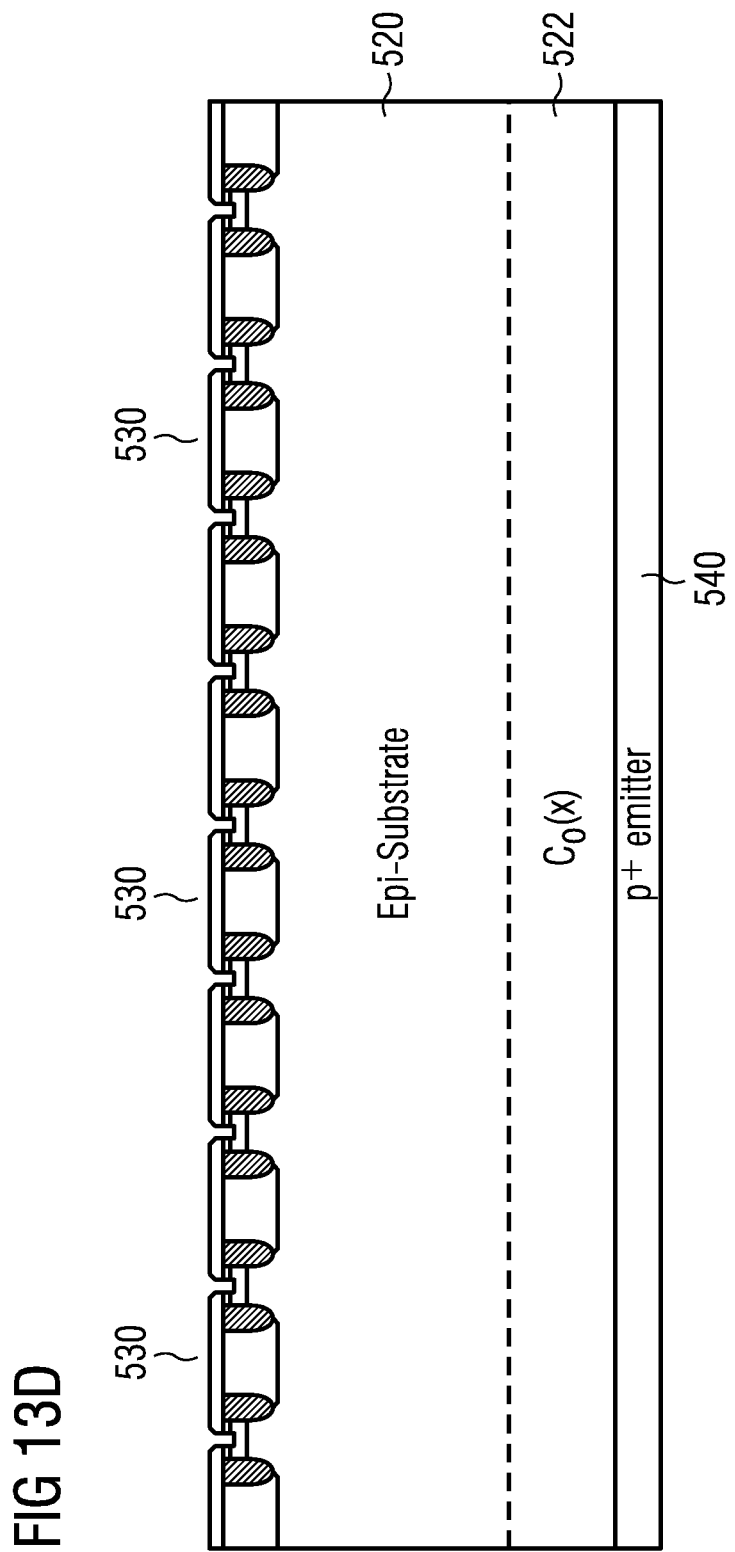

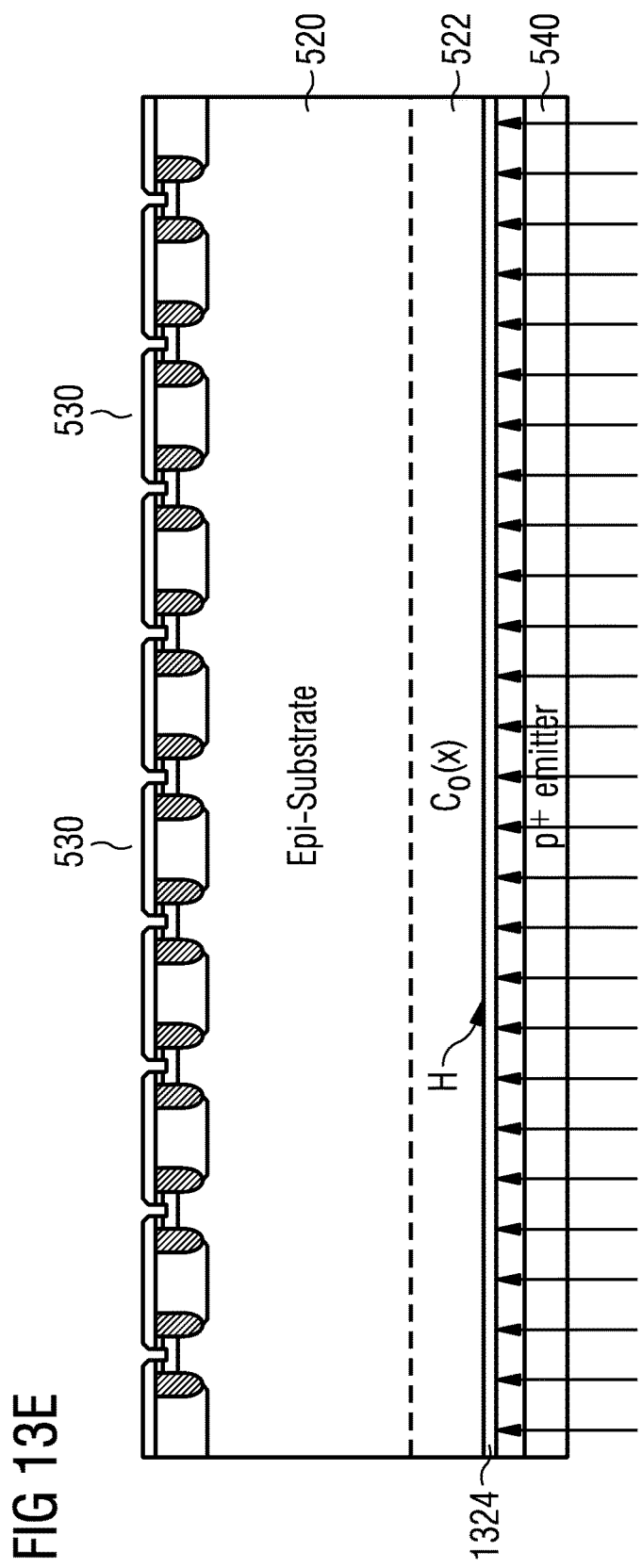

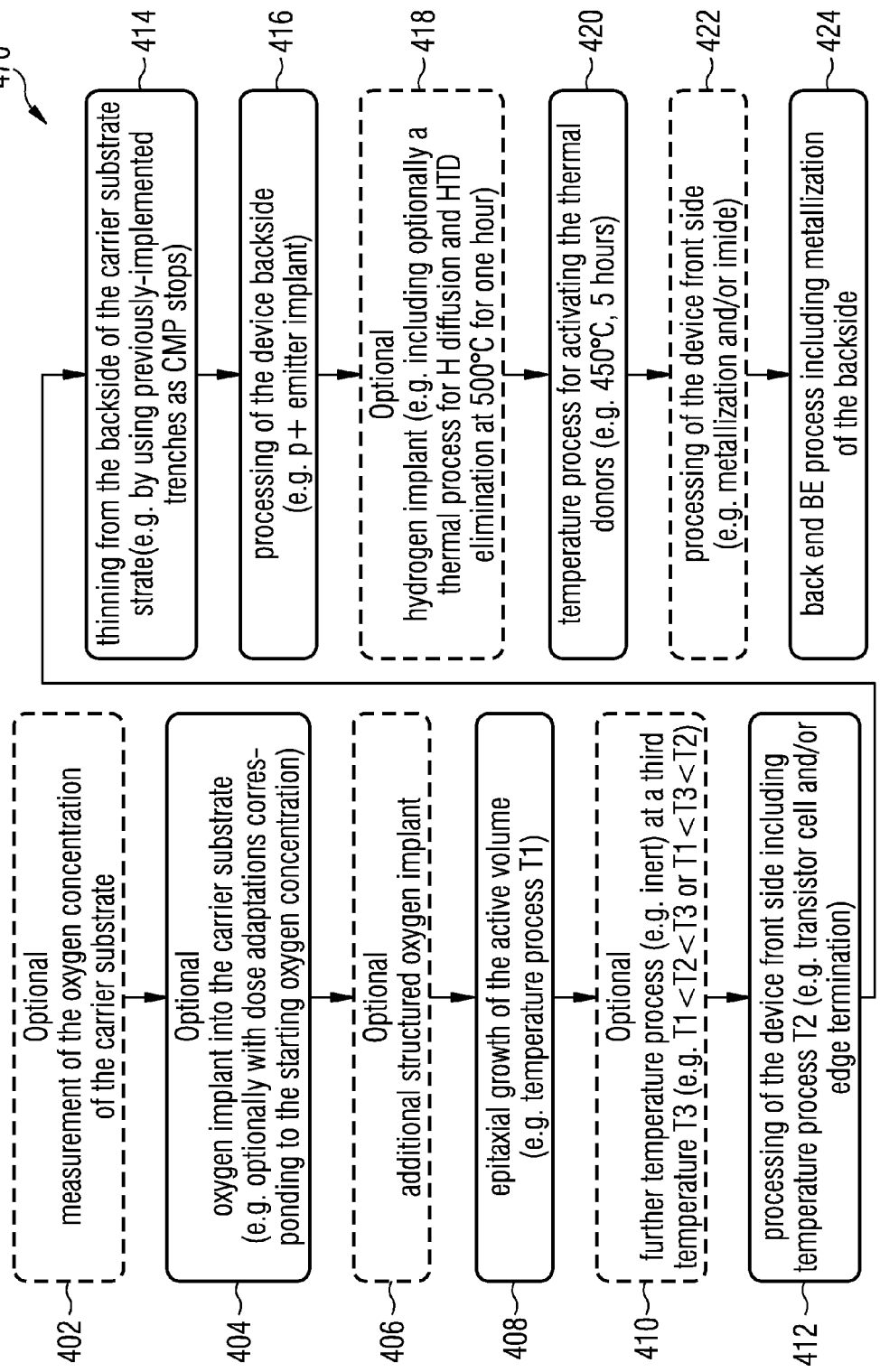

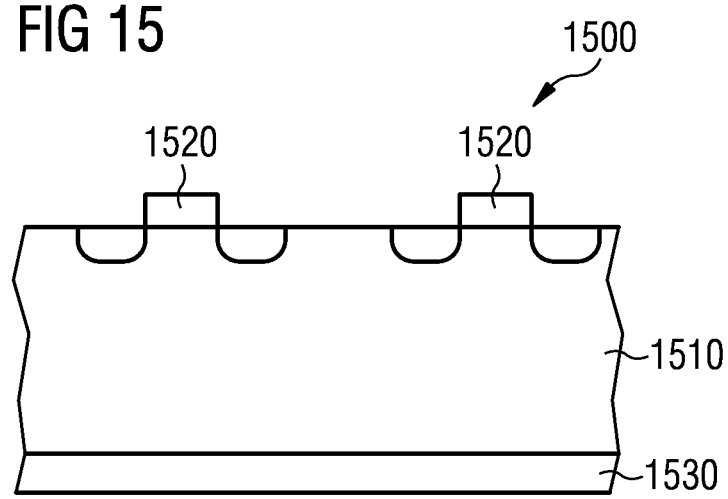
FIG 15
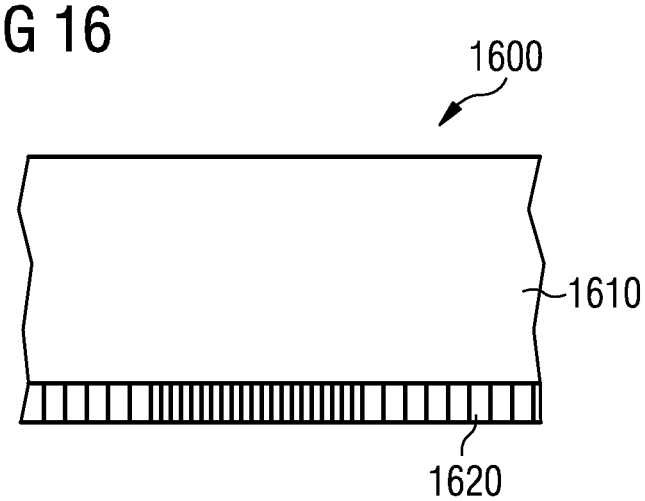
FIG 16
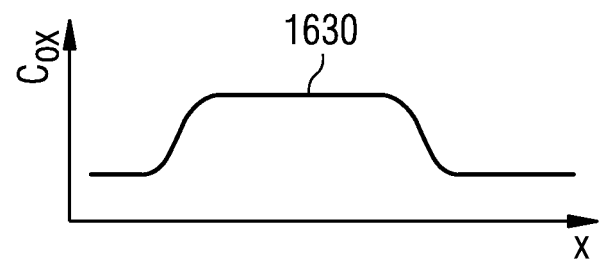

METHOD FOR FORMING A SEMICONDUCTOR DEVICE AND SEMICONDUCTOR DEVICE

PRIORITY CLAIM

This application claims priority to German Patent Application No. 10 2014 106 594.8 filed on 9 May 2014, the content said application incorporated herein by reference in its entirety.

TECHNICAL FIELD

Embodiments relate to measures for increasing the durability or life-cycle of semiconductor devices and in particular to a semiconductor device and a method for manufacturing a semiconductor device.

BACKGROUND

The durability and life cycle of a semiconductor device is often affected by voltage peaks or current peaks during switch-off of the semiconductor device. For example, large currents can occur during the shutdown of power semiconductors. It is desired to decrease the risk of destruction due to high currents in order to increase the durability or life cycle of semiconductor devices, for example.

SUMMARY

There is a demand for providing a concept for increasing the durability or life cycle of semiconductor devices.

Such a demand may be satisfied by the subject matter of the claims.

Some embodiments relate to a method for forming a semiconductor device. The method comprises depositing an epitaxial layer on a semiconductor substrate and forming an oxygen diffusion region within the epitaxial layer by oxygen diffusion from the semiconductor substrate into a part of the epitaxial layer. Further, the method comprises tempering at least the oxygen diffusion region of the epitaxial layer at a temperature between 400° C. and 480° C. for more than 15 minutes.

Some embodiments relate to a method for forming a semiconductor device. The method comprises implanting oxygen into a semiconductor substrate and depositing an epitaxial layer on the semiconductor substrate. Further, the method comprises forming an oxygen diffusion region within the epitaxial layer by oxygen diffusion from the semiconductor substrate into a part of the epitaxial layer.

Some embodiments relate to a method for forming a semiconductor device. The method comprises depositing an epitaxial layer on a semiconductor substrate and forming an oxygen diffusion region within the epitaxial layer by oxygen diffusion from the semiconductor substrate into a part of the epitaxial layer. Further, the method comprises implanting hydrogen into the diffusion region of the epitaxial layer.

Some embodiments relate to a semiconductor device comprising an epitaxial substrate and a plurality of transistor structures or diode structures located at a front side of the epitaxial substrate. Further, the semiconductor device comprises a donor region located at a backside of the epitaxial substrate. The donor region comprises more than $10^{14}$ oxygen induced thermal donors per $cm^3$ having a donor energy level between 30 meV and 200 meV.

Some embodiments relate to a semiconductor device comprising an epitaxial substrate with a donor region. The donor region comprises a laterally-varying oxygen concentration.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which

FIG. 4 shows a flowchart of a method for forming a semiconductor device including activating thermal donors;

FIGS. 5a to 5d show schematic cross-sections of the forming of a semiconductor device by the method shown in FIG. 4;

FIGS. 7a to 7d show schematic cross-sections of the forming of a semiconductor device according to the method shown in FIG. 6;

FIG. 8 shows a flowchart of a method for forming a semiconductor device including a structured oxygen implant;

FIGS. 9a to 9e show schematic cross-sections of the forming of a semiconductor device according to the method shown in FIG. 8;

FIG. 10 shows a flowchart of a method for forming a semiconductor device including an additional temper process;

FIGS. 11a to 11f show schematic cross-sections of the forming of a semiconductor device according to the method shown in FIG. 10;

FIG. 12 shows a flowchart of a method for forming a semiconductor device including a hydrogen implant;

FIGS. 13a to 13f show schematic cross-sections of the forming of a semiconductor device according to the method shown in FIG. 12;

FIG. 14 shows a flowchart of a method for forming a semiconductor device;

FIG. 15 shows a schematic cross-section of a semiconductor device;

FIG. 16 shows a schematic cross-section of a semiconductor device;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, acts, operations, elements and/or components, but do not preclude the presence or addition of one or more other features, integers, acts, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
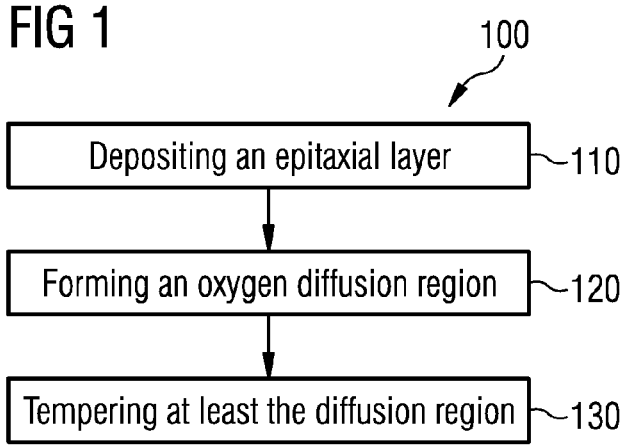
FIG. 1 shows a flowchart of a method for forming a semiconductor device including tempering of the diffusion region.

FIG. 1 shows a flowchart of a method 100 for forming a semiconductor device according to an embodiment. The method 100 comprises depositing 110 an epitaxial layer on a semiconductor substrate and forming 120 an oxygen diffusion region within the epitaxial layer by oxygen diffusion from the semiconductor substrate into a part of the epitaxial layer. Further, the method 100 comprises tempering 130 at least the oxygen diffusion region of the epitaxial layer at a temperature between 400° C. and 480° C. for more than 15 minutes.

By implementing oxygen atoms into the epitaxial layer and tempering the resulting oxygen diffusion region, a region of thermal donors can be formed. The charge carrier mobility within the diffusion region may be reduced in comparison to the usage of other donors (e.g. phosphorus). In this way, the softness of the switching of semiconductor devices (e.g. switching-off of an insulated gate bipolar transistor or diode) may be improved. A semiconductor device with improved softness may comprise an increased durability or life cycle, for example.

The semiconductor substrate of the semiconductor device may be a silicon-based semiconductor substrate (e.g. CZ wafer or MCZ wafer), a silicon carbide-based semiconductor substrate, a gallium arsenide-based semiconductor substrate or a gallium nitride-based semiconductor substrate, for example.

The epitaxial layer may be deposited 110 on the semiconductor substrate by any epitaxial processing technology capable of forming an epitaxial layer on a given or desired semiconductor substrate. For example, the epitaxial layer may be a silicon layer, a silicon carbide layer, a gallium arsenide layer or a gallium nitride layer.

During and/or after the deposition of the epitaxial layer, oxygen atoms can diffuse from the semiconductor substrate to the epitaxial layer causing a region within increased oxygen concentration in comparison to other regions of the epitaxial layer. The oxygen diffusion is controllable in a well-defined manner by the oxygen concentration of the semiconductor substrate (e.g. of a surface region of the semiconductor substrate facing the epitaxial layer), the process temperatures and with it the oxygen solubility limit and processing time of the deposition of the epitaxial layer and/or manufacturing processes following the deposition 110 of the epitaxial layer, for example. In other words, the oxygen diffusion from the semiconductor substrate into the epitaxial layer may already start during the deposition 110 of the epitaxial layer.

At least the oxygen diffusion region (e.g. or the part of the semiconductor device already formed before the tempering) of the epitaxial layer is tempered or heated at a temperature between 400° C. and 480° C. (or between 420° C. and 470° C. or between 440° C. and 460° C., e.g. 450° C.) for more than 15 minutes (e.g. for more than 40 minutes and less than 30 hours, for more than one hour and less than 20 hours or for more than 5 hours and less than 15 hours). In the temperature range between 400° C. and 480° C., the forming of long oxygen chains may be triggered. Such long oxygen chains within the epitaxial layer may form thermal donors with at least a donor energy level between 30 meV and 200 meV (or between 40 meV and 100 meV, e.g. substantially 50 meV), for example. In other words, the epitaxial layer may be heated to a predefined temperature (or temperature range) for a predefined time in order to activate the thermal donor property of the oxygen atoms within the oxygen diffusion region, for example.

Figure 18:
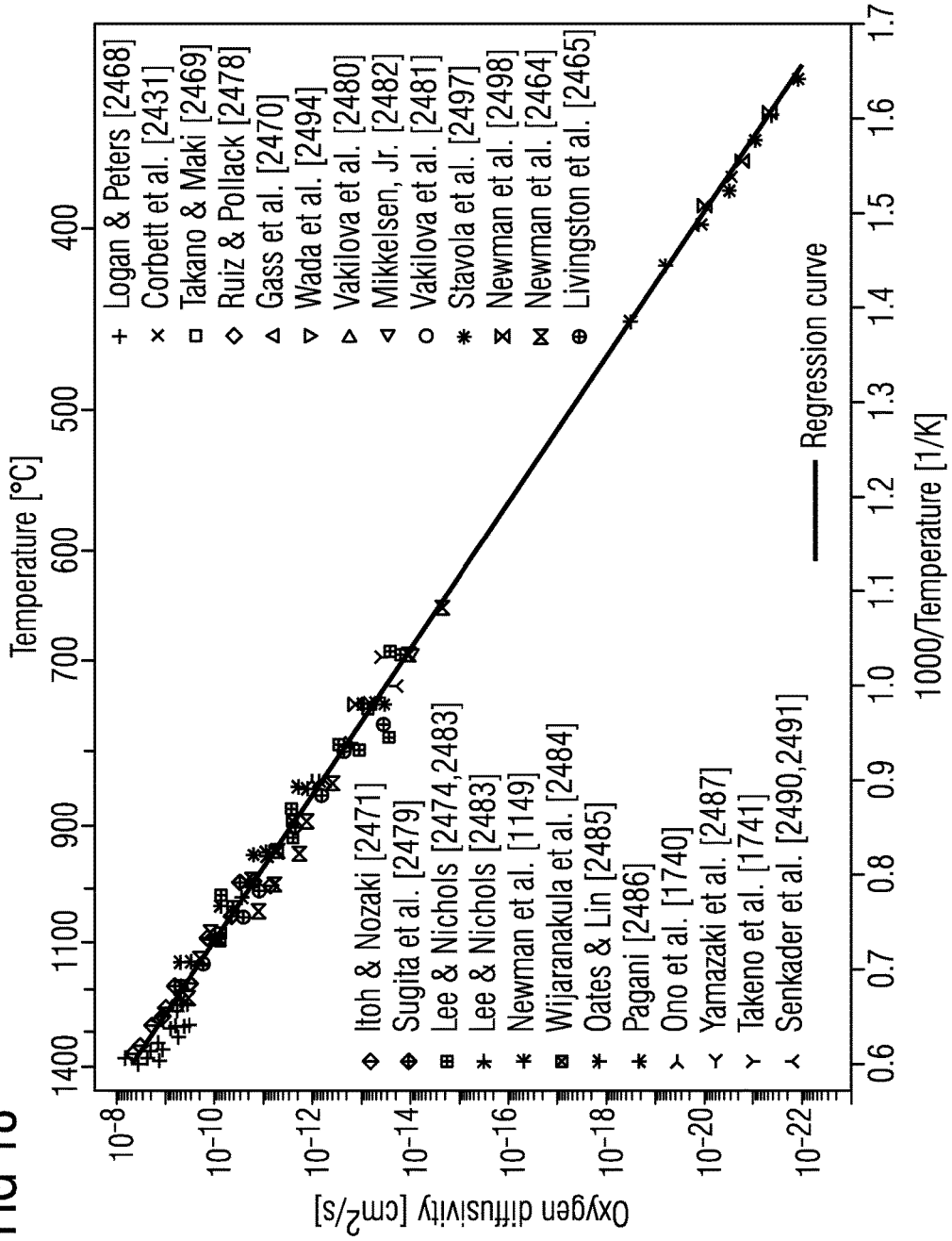
FIG. 18 shows the diffusion constant of oxygen (interstitial) in silicon.
Figure 19:
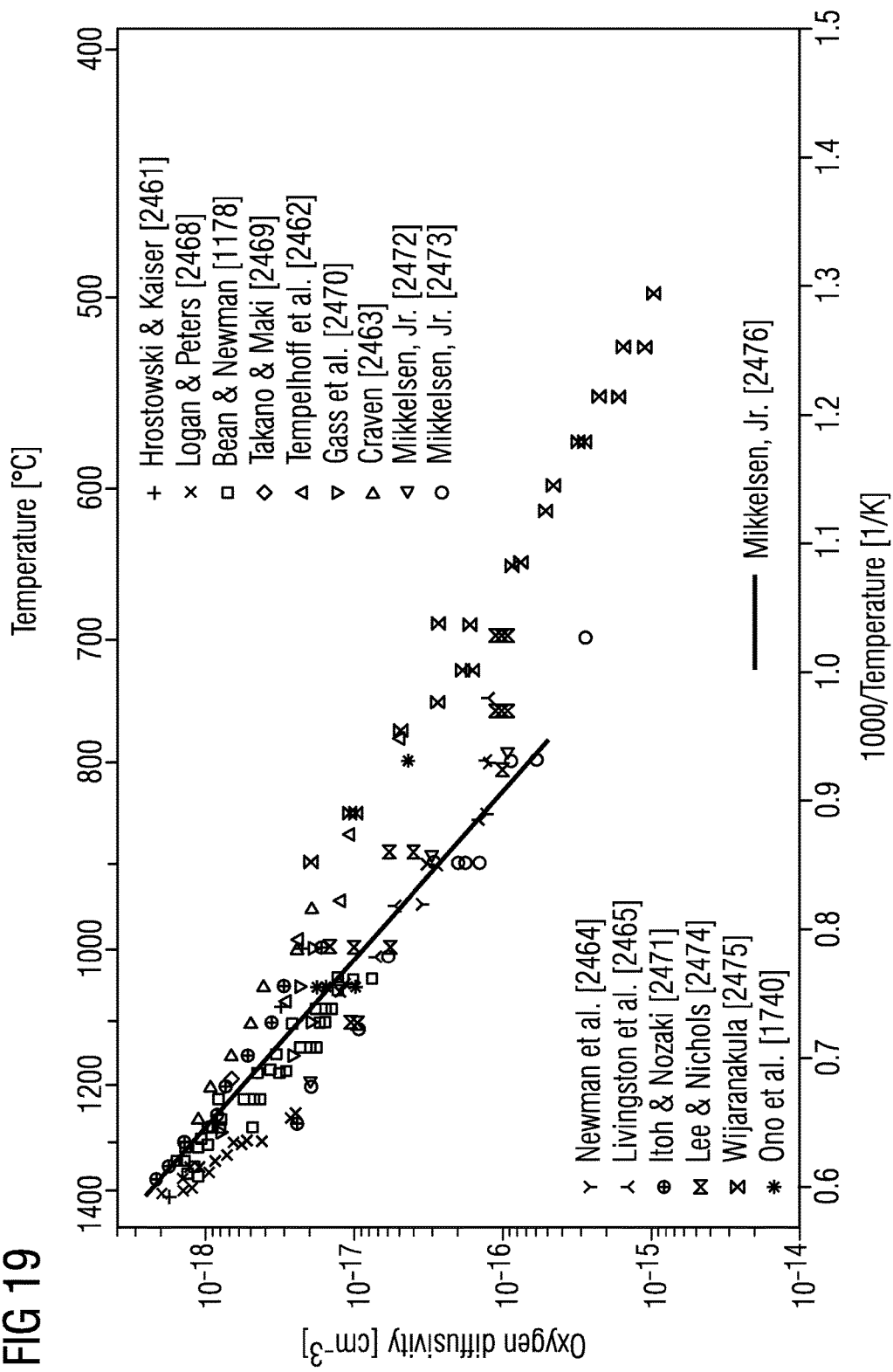
FIG. 19 shows the solubility of oxygen (interstitial) in silicon.

For example, an oxygen concentration within at least a part of the semiconductor substrate is larger than a solid state solubility of oxygen within the epitaxial layer, for example, at a maximum process temperature Tmax, during all following processing steps or at 1100° C. In this way, the in-diffusion of oxygen atoms into the substrate may be controlled in a very homogeneous and reproducible manner by the temperature dependency of the oxygen solubility limit. For example, FIG. 18 shows the oxygen diffusivity for different temperatures and FIG. 19 shows the oxygen solubility at different temperatures, as published in "Intrinsic point defects, impurities, and their diffusion in silicon", P. Pichler, Springer, 2004.

The oxygen diffusion region may be a region of the epitaxial layer comprising a higher oxygen concentration than a remaining part of the epitaxial layer (e.g. more than twice or more than 10 times higher). The oxygen diffusion region may comprise a thickness (e.g. measured from a surface of the epitaxial layer into the epitaxial layer) of more than 1 μm (or more than 5 μm or more than 10 μm or a thickness between 1 μm and 100 μm, between 5 μm and 50 μm or between 10 μm and 30 μm), for example.

Optionally, processes following the tempering of the diffusion region may use temperatures below 400° C. In other words, process acts for forming the semiconductor device following the tempering of at least the diffusion region of the epitaxial layer at a temperature between 400° C. and 480° C. may be done mainly at temperatures below 400° C. For example, the following process acts may avoid temperatures above 400° C. for durations longer than one minute, for example. For example, all process acts for forming the semiconductor device following the tempering of the diffusion region may be performed completely below 400° C. In this way, a destructive effect to the oxygen chains formed during the tempering of the oxygen diffusion region or a further formation of thermal donors may be avoided or may be low. Alternatively or optionally, at least a part of the thermal donor annealing process at temperatures between 420° C. and 480° C. may be part of another process which requires or preforms an anneal step, for example.

The method 100 may comprise one or more additional optional acts corresponding to one or more aspects mentioned in connection with a described concept or one or more embodiments described below (e.g. implanting oxygen into the semiconductor substrate and/or implanting hydrogen into the oxygen diffusion region).

Figure 2:
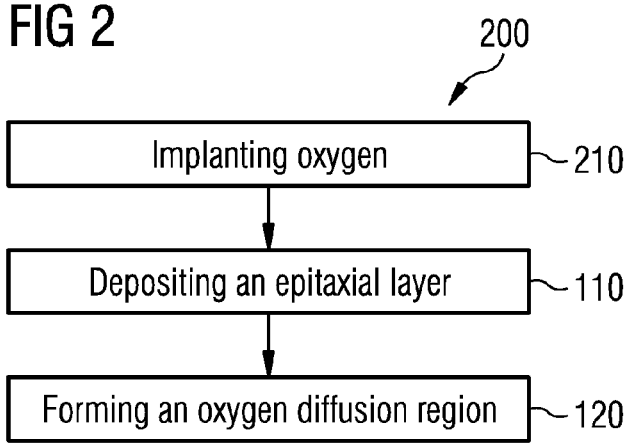
FIG. 2 shows a flowchart of a method for forming a semiconductor device including implanting oxygen.

FIG. 2 shows a flowchart of a method 200 for forming a semiconductor device according to an embodiment. The method 200 comprises implanting 210 oxygen into a semiconductor substrate and depositing 110 an epitaxial layer on the semiconductor substrate. Further, the method comprises forming 120 an oxygen diffusion region within the epitaxial layer by oxygen diffusion from the semiconductor substrate into a part of the epitaxial layer.

By implanting oxygen into the semiconductor substrate, an oxygen concentration within the semiconductor substrate can be increased to a desired concentration. In this way, the amount of oxygen diffusing into the epitaxial layer can be influenced. The oxygen diffusion region may build up a region of thermal donors with a desired donor concentration due to the controllable amount of oxygen diffusing into the epitaxial layer. In this way, the softness of the switching of the semiconductor device may be improved.

The implant 210 of oxygen ions into the semiconductor substrate may be done with low implant energy so that the oxygen concentration is increased within a surface region (e.g. extending from a surface of the semiconductor substrate into the semiconductor substrate) of the semiconductor substrate.

The oxygen implant may be done throughout the whole surface of the semiconductor substrate or may be done at a part of the surface of the semiconductor substrate only. For example, an implant window of the ion implanter may be reduced to a desired part of the semiconductor substrate (e.g. semiconductor wafer) so that the desired part of the semiconductor substrate is exposed to the oxygen implant only. Alternatively, a mask layer may be formed on the surface of the semiconductor substrate (e.g. photoresist layer) to mask or avoid the oxygen implant at desired regions of the semiconductor substrate. In this way, a lateral variation of the oxygen concentration within the semiconductor substrate may be achievable, for example.

Afterwards, the oxygen diffusion region may be formed by oxygen diffusion from the semiconductor substrate with laterally varying oxygen concentration resulting in an oxygen diffusion region with laterally varying oxygen concentration. For example, at a predefined distance from a surface of the epitaxial layer, a maximal oxygen concentration of the oxygen diffusion region may be higher than twice (or higher than ten times) a minimal oxygen concentration at the predefined distance.

In this way, an alternating sequence of first concentration regions and second concentration regions distributed laterally in a direction along a surface of the semiconductor substrate may be obtained.

Optionally, an oxygen concentration of the semiconductor substrate is measured before the oxygen implant. In this way, the already existing oxygen concentration within the semiconductor substrate can be considered for the determination of the oxygen dose to be implanted in order to obtain a desired resulting oxygen concentration at least at a surface region of the semiconductor substrate, for example.

More details regarding the deposition 110 of the epitaxial layer and for forming 120 the oxygen diffusion region within the epitaxial layer are mentioned in connection with FIG. 1 or one or more embodiments described below.

The method 200 may comprise one or more additional optional acts corresponding to one or more aspect(s) mentioned in connection with a described concept or one or more embodiments described above or below (e.g. tempering the diffusion region at the temperature between 400° C. and 480° C. for more than 15 minutes and/or implanting hydrogen into the diffusion region).

Figure 3:
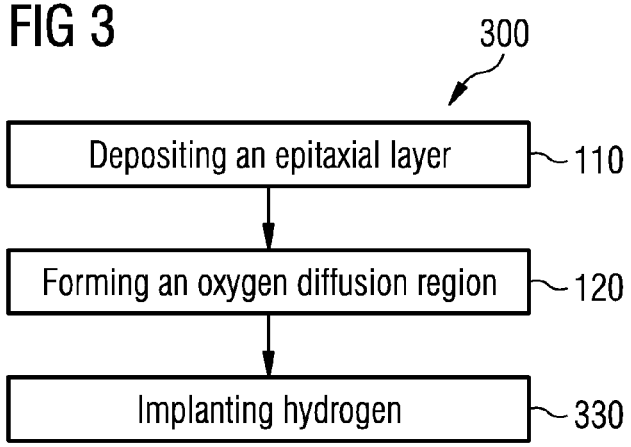
FIG. 3 shows a flowchart of a method for forming a semiconductor device including implanting hydrogen.

FIG. 3 shows a method 300 for forming a semiconductor device according to an embodiment. The method 300 comprises depositing 110 an epitaxial layer on a semiconductor substrate and forming 120 an oxygen diffusion region within the epitaxial layer by oxygen diffusion from the semiconductor substrate into a part of the epitaxial layer. Further, the method 300 comprises implanting 330 hydrogen into the oxygen diffusion region of the epitaxial layer.

By implanting hydrogen ions into the oxygen diffusion region, the growth of oxygen chains may be catalyzed or stimulated by the hydrogen. For example the process time for tempering the oxygen diffusion region at a temperature between 400° C. and 480° C. may be reduced or the tempering process may be avoided due to the catalyzing effect of the hydrogen within the oxygen diffusion region, for example. In this way, the generation of thermal donors represented by oxygen within the oxygen diffusion region may be improved. The switching behavior of the semiconductor device may be smoothed due to the thermal donors. In this way, the durability and/or the lifecycle of the semiconductor device may be increased.

The hydrogen may be implanted 330 with an implant energy suitable for implanting hydrogen into the oxygen diffusion region of the epitaxial layer. Alternatively or additionally, a hydrogen in-diffusion step may be performed (e.g. by a plasma supplied in-diffusion)

Optionally, an additional annealing act may be performed to improve the catalyzing effect of the hydrogen within the oxygen diffusion region (e.g. to remove any (parasitic) H-rel thermal donors induced by the H implant). In other words, the method 300 may comprise tempering or heating at least an oxygen diffusion region of the epitaxial layer at a temperature between 500° C. and 600° C. for more than 15 minutes after the hydrogen implant.

More details in connection with depositing 110 the epitaxial layer and forming 120 the oxygen diffusion region are mentioned in connection with FIG. 1 and/or one or more embodiments described below, for example.

The method 300 may comprise one or more additional optional acts corresponding to one or more aspects mentioned in connection with a described concept or one or more embodiments described above or below (e.g. tempering the oxygen diffusion region at a temperature between 400° C. and 480° C. for more than 15 minutes and/or implanting oxygen into the semiconductor substrate).

As already mentioned, the diffusion process of the oxygen from the semiconductor substrate to the epitaxial layer may already start during the deposition 110 of the epitaxial layer. For example, depositing 110 the epitaxial layer on the semiconductor substrate may be at least partly done at a first temperature range above 1000° C. (e.g. 1050° C. for 100 minutes or another temperature and time depending on the semiconductor device to be formed) causing at least a part of the oxygen diffusion from the semiconductor substrate into a part of the epitaxial layer forming the oxygen diffusion region within the epitaxial layer. The first temperature range may be defined by a single temperature above 1000° C. for a predefined time or may be defined by a varying temperature profile comprising different temperatures above 1000° C. at different times, for example.

Optionally, a method described above may further comprise forming field-effect transistor structures at a front side of the semiconductor device. In other words, field-effect transistor structures may be formed at a surface of the epitaxial layer opposite to the semiconductor substrate (e.g. carrier substrate) or at a layer deposited on the epitaxial layer, for example.

The front side of the semiconductor device may be a side of the semiconductor device comprising more complex structures than a backside of the semiconductor device. For example, the field-effect transistor structures (e.g. especially the gate of a field-effect transistor) of an IGBT may be located at the front side of a semiconductor device, while an emitter may be located at a backside of the insulated gate bipolar transistor.

The IGBT transistor or the field-effect transistor structures may be n-channel field-effect transistor structures.

The oxygen diffusion region of the epitaxial layer may form a field stop region of an insulated gate bipolar transistor (e.g. layer between a backside emitter and a drift region), for example.

The forming of the field-effect transistor structures may be at least partly done at a second temperature range being higher than a first temperature range. In this way, further oxygen may diffuse from the semiconductor substrate to the epitaxial layer. For example, the second temperature range may comprise one or more temperatures for one or more different times. For example, at least one temperature of the second temperature range may be above 1050° C. (e.g. 1100° C.).

A method described above may further comprise optionally an additional tempering of at least the oxygen diffusion region of the epitaxial layer at a third temperature range being higher than the second temperature range. In this way, the oxygen diffusion from the semiconductor substrate to the epitaxial layer may be influenced independent from the deposition of the epitaxial layer and/or the forming of the field-effect transistor structures to obtain a desired oxygen concentration or oxygen distribution within the oxygen diffusion region, for example. The additional tempering of the oxygen diffusion region at the third temperature range may be done before or after forming the field-effect transistor structures, for example.

A method described above may further comprise forming an emitter layer at the backside of the semiconductor device. In this way, an insulated gate bipolar transistor may be manufactured, for example.

FIG. 4 shows a flowchart of a method 400 for forming a semiconductor device. The process overview indicates an epitaxial growth 408 of the active volume (e.g. temperature process T1) representing the deposition of the epitaxial layer mentioned above and processing 412 of the device front side including temperature process T2 (e.g. transistor cell and/or edge termination, forming a field-effect transistor structure or an anode region). Further, the method 400 comprises thinning 414 from the backside of the carrier substrate representing the semiconductor substrate (e.g. by using previously-implemented trenches as chemical-mechanical polishing CMP stops) and processing 416 of the device backside (e.g. p+ emitter implant). Additionally, the method 400 comprises a temperature process 420 for activating the thermal donors (e.g. 400° C., 5 hours), an optional thin wafer process (thinning of wafer), a processing 422 of the device front side (e.g. metallization and/or imide) and a back end BE process 424 including metallization of the backside. In this way a diode and/or an insulated gate bipolar transistor may be formed, for example. Further, the flowchart indicates further optional acts, which are described in connection with one or more examples below.

Figure 5A:
Figure 5B:
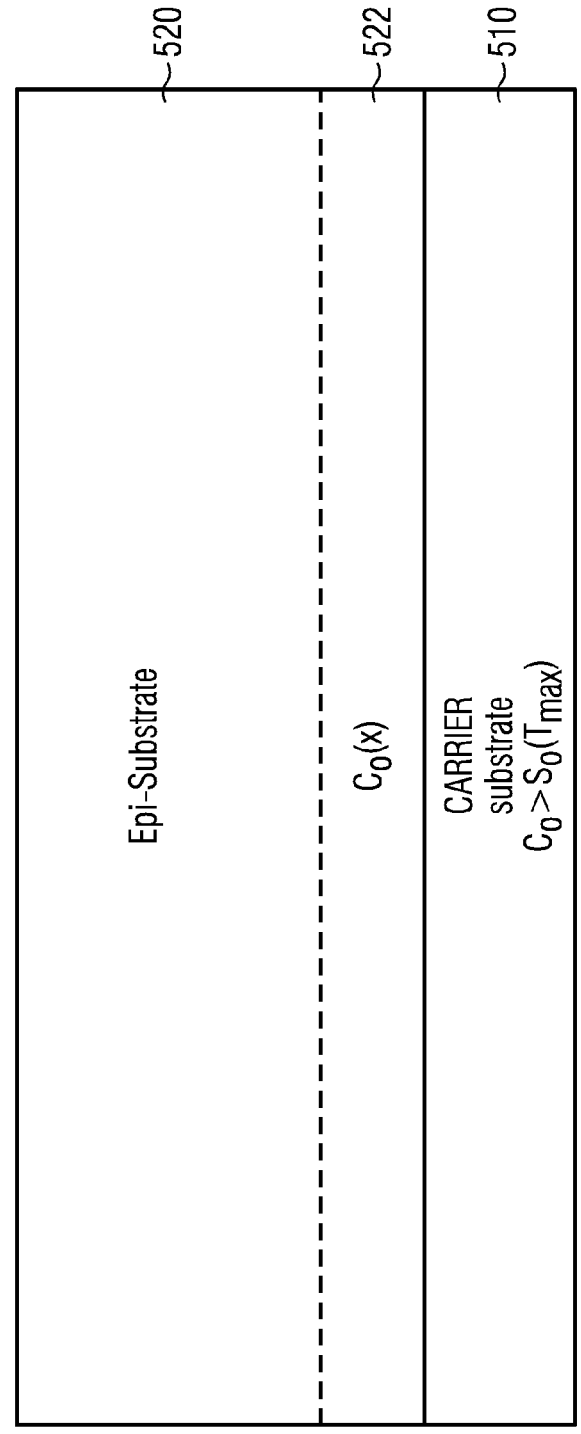

FIGS. 5a to 5d show schematic cross-sections of a semiconductor device during forming the semiconductor device according to the method shown in FIG. 4. FIG. 5a shows the carrier substrate 510 with an oxygen concentration $C_O$ above the maximum solid state solubility $S_O(T_{max})$ of the following process. FIG. 5b shows the epitaxial growth of the active device volume 520 (e.g. at a thermal budget T1 of 1050° C. for 100 minutes for a 1200 V device, for example). Oxygen diffuses into the active volume 520 (into the epitaxial layer or substrate) during the process corresponding the diffusion constant D(T) of oxygen and the solid state solubility S(T) of oxygen, for example.

Consequently, an oxygen diffusion region 522 is formed within the epitaxial layer 520 by oxygen diffusion from the semiconductor substrate 510 into the epitaxial substrate 520.

FIG. 5c shows the processing of the device front side (e.g. insulated gate bipolar transistor IGBT transistor cells 530) including a p-body drive T2 (e.g. at 1100° C.). The p-body drive may be a temperature process for annealing or diffusing the doping of the field-effect transistor structure (e.g. after p implant). Due to the usage of temperatures within a second temperature range T2, the oxygen diffusion region 522 expands further into the epitaxial layer 520.

FIG. 5d shows the semiconductor device after grinding the wafer (e.g. removal of the carrier substrate) and implantation of the backside p+ emitter 540. Optionally, the thinning of the wafer is done by using CMP stop structures. Further, an activating process of the oxygen thermal donors OTD based on the controlled generated oxygen profile is performed.

The method 400 may comprise one or more additional optional acts corresponding to one or more aspects mentioned in connection with the described concept or one or more embodiments described above or below.

Figure 6:
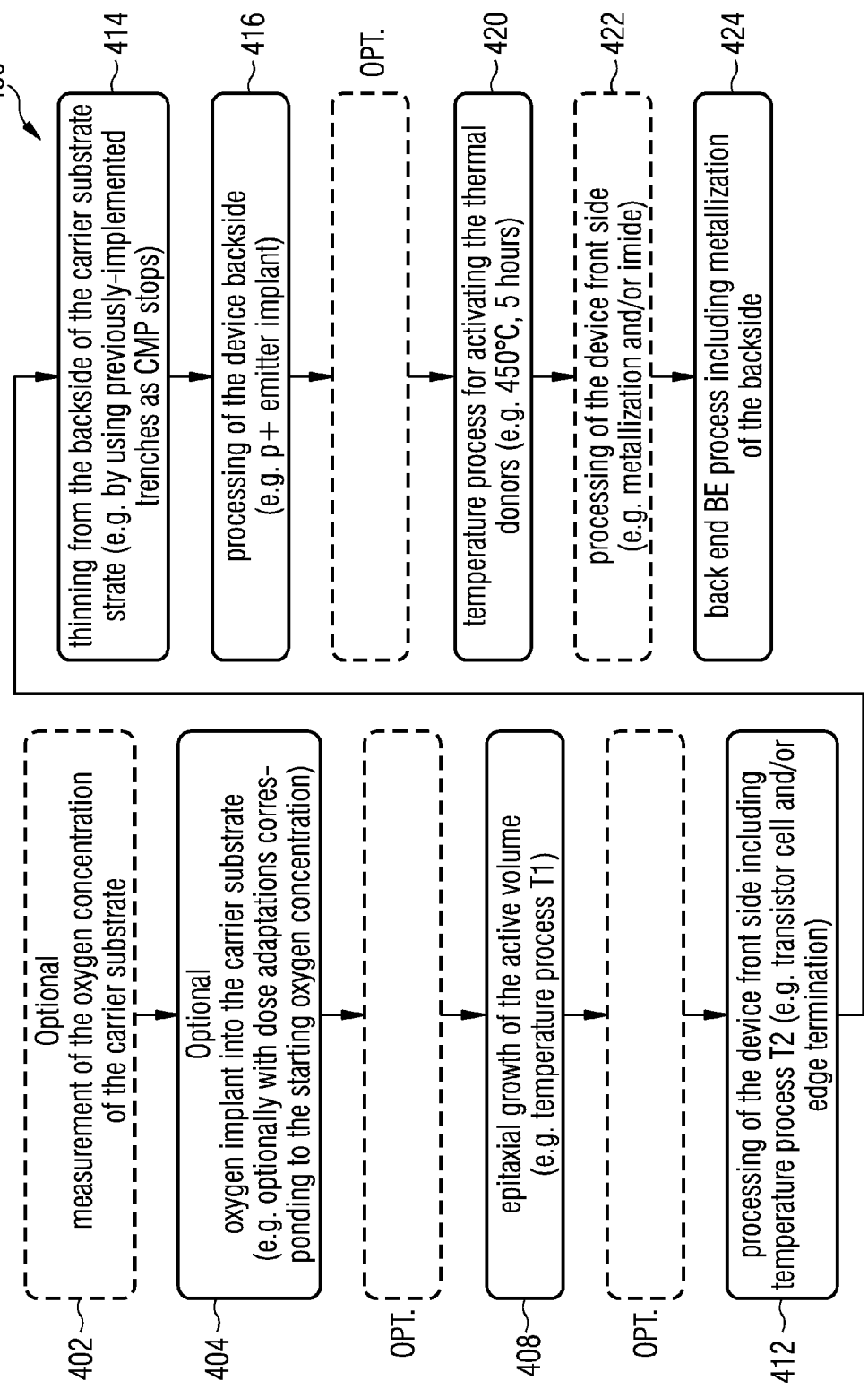
FIG. 6 shows a flowchart of a method for forming a semiconductor device including an oxygen implant.

FIG. 6 shows a flowchart of a method 430 for forming a semiconductor device according to an embodiment. The process overview comprises an optional measurement 402 of the oxygen concentration of the carrier substrate (semiconductor substrate). Further, the method 430 comprises an oxygen implant 404 into the carrier substrate (e.g. optionally with dose adaptations corresponding to the starting oxygen concentration) and an epitaxial growth 408 of the active volume (e.g. by temperature process T1). Additionally, the method 430 comprises processing 412 of the device front side including temperature process T2 (e.g. transistor cells, etch termination and/or field-effect transistor structures) and a thinning of the backside of the carrier substrate 414 (e.g. by using previously-implemented trenches as CMP stops). Further, the method 430 comprises processing 416 the device front side (e.g. p+ emitter implant) and a temperature process 420 for activating the thermal donors (e.g. 400° C., 5 hours). Additionally, the method 430 comprises an optional wafer thinning, a processing 422 of the device front side (e.g. metallization, imide) and a back end BE processing 424 including a metallization of the backside. Further, the flowchart of FIG. 6 indicates additional optional acts which are described in connection with one or more examples above or below.

Figure 7B:
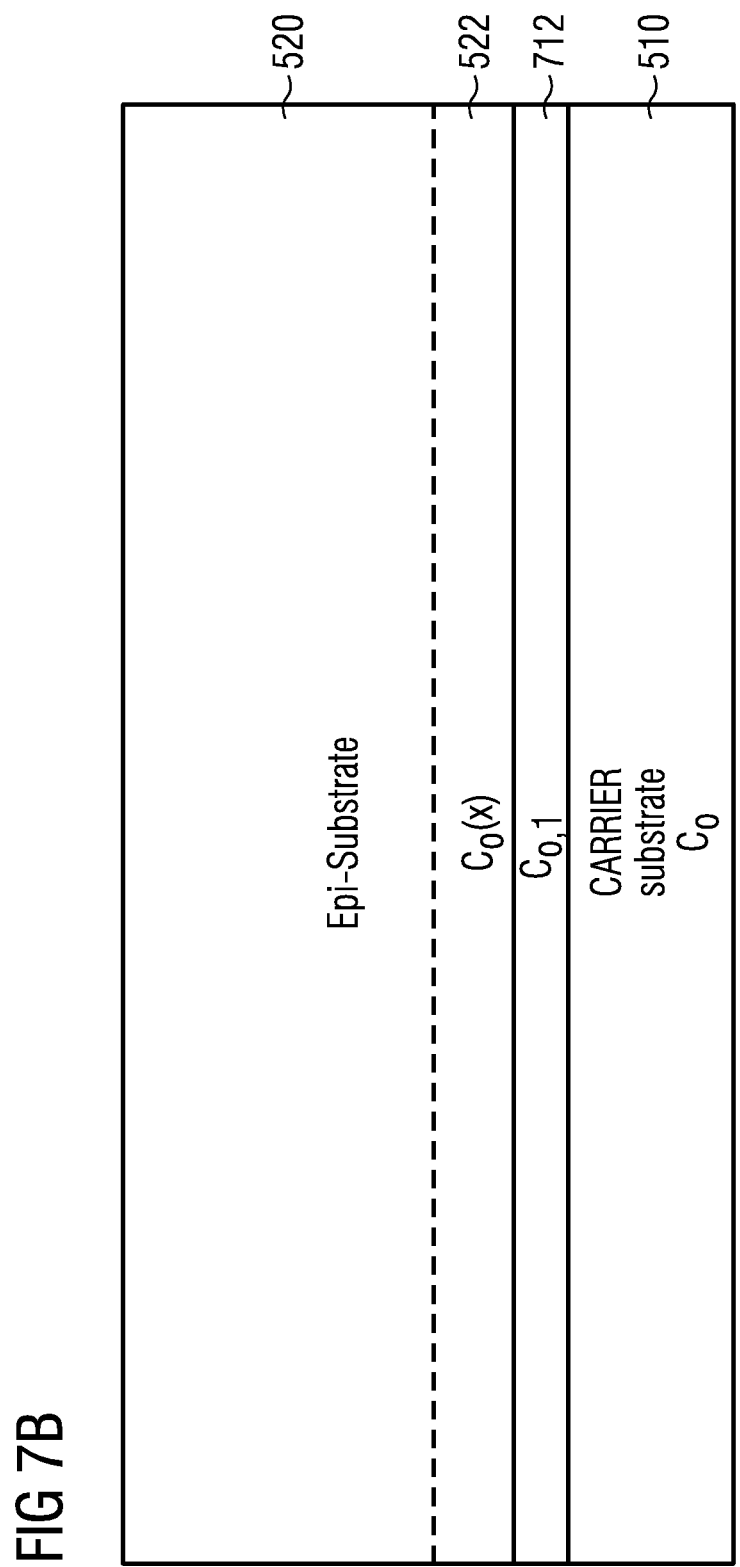

FIGS. 7a to 7d show schematic cross-sections of the forming of a semiconductor device according to the method shown in FIG. 6. FIG. 7a shows an oxygen implant into a carrier substrate (semiconductor substrate) 510. In this way, a surface region 712 with increased oxygen concentration $C_{O,1}$, may be formed. Optionally, the oxygen implant may be done with a dose adaptation depending on the oxygen concentration $C_O$ of the (remaining) carrier substrate, for example.

FIG. 7b shows an epitaxial growth of the active device volume 520 (e.g. at a thermal budget T1 of, for example, 1050° C. for 100 minutes for a 1200 V device). During the deposition of the epitaxial substrate, oxygen diffuses into the active volume according to the diffusion constant D(T) of oxygen and the solid state solubility S(T). In this way, an oxygen diffusion region 522 with an oxygen concentration $C_O(T1)<C_{O,1}$ may be formed.

FIG. 7c shows the processing of the device front side (e.g. IGBT transistor cells) including a P body drive (e.g. at 1100° C.) resulting in an oxygen diffusion region 522 with an oxygen concentration $C_O(T2) \leq C_{O,1}$, for example.

Figure 7D:
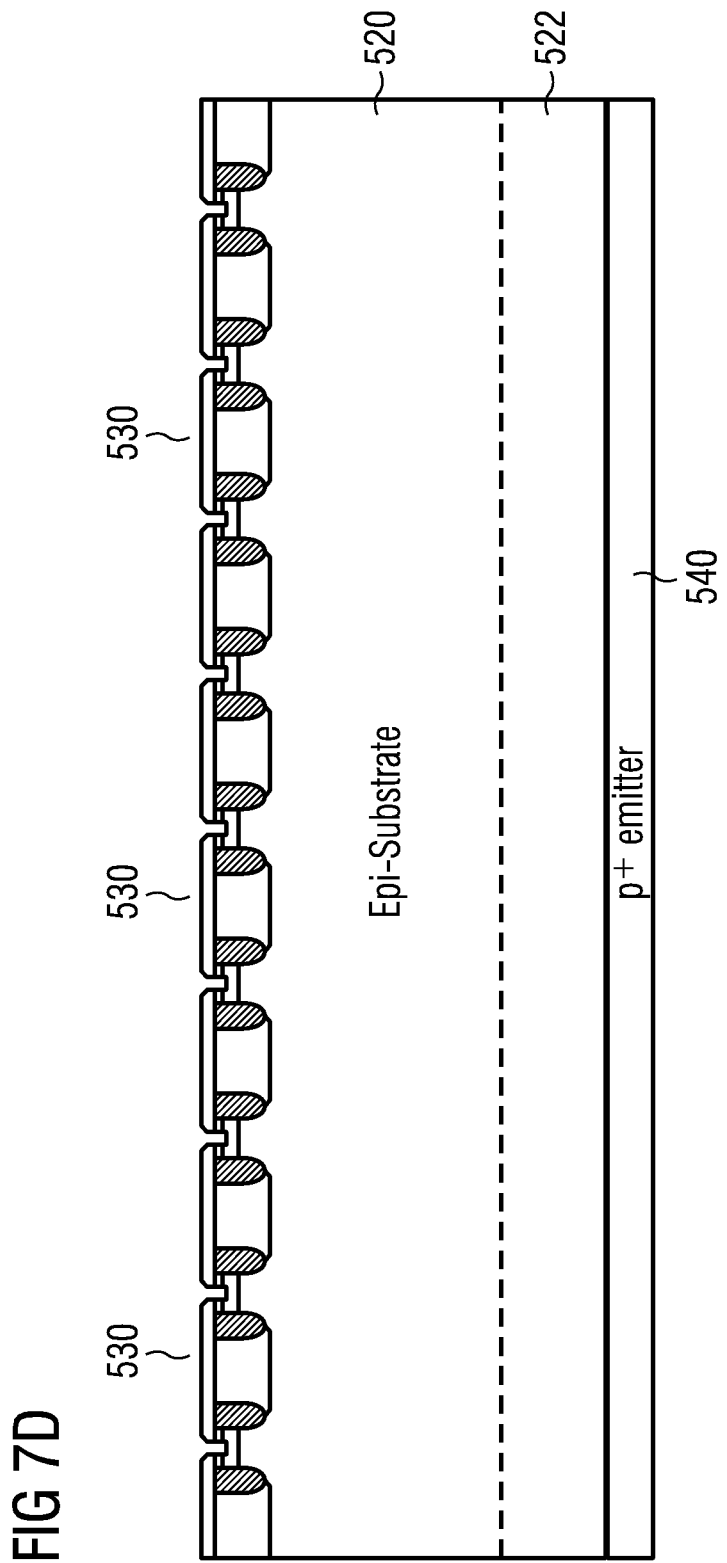

FIG. 7d shows the semiconductor device after grinding the wafer (e.g. removal of the carrier substrate) and implantation of the backside p+ emitter 540. Optionally, the thinning of the wafer is done by using CMP stop structures. Further, an activating process of the oxygen thermal donors OTD based on the controlled generated oxygen profile is performed.

The method 430 may comprise one or more additional optional acts corresponding to one or more aspect described in connection with a concept or one or more embodiments described above or below.

FIG. 8 shows a flowchart of a method 440 for forming a semiconductor device according to an embodiment. The method 440 is similar to the method shown in FIG. 6, but comprises additionally a structured oxygen implant 406. Further, the flowchart of FIG. 8 indicates additional optional acts which are described in connection with one or more examples above or below.

Figure 9D:
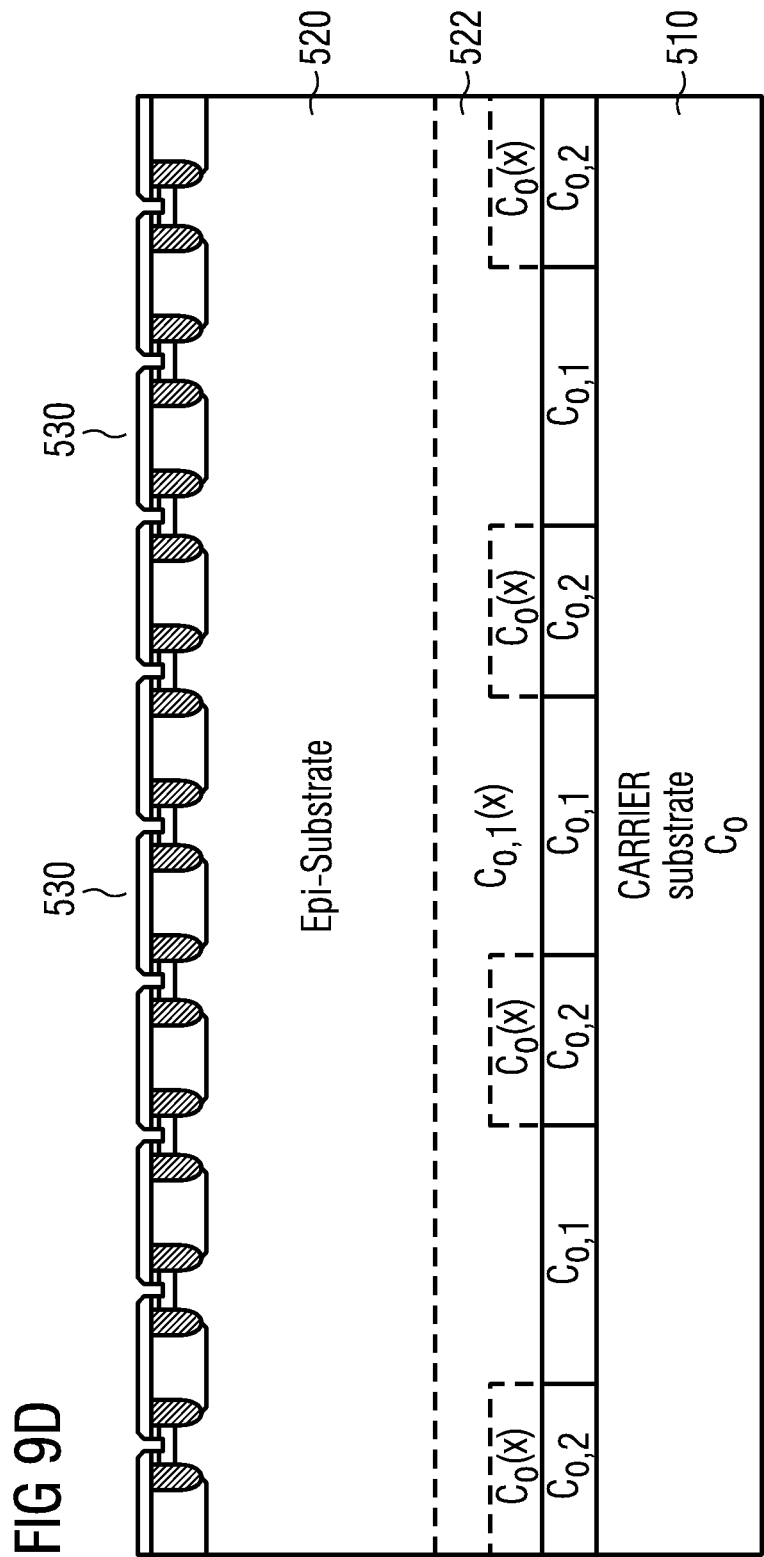

FIGS. 9a to 9e show schematic cross-sections of the forming a semiconductor device according to the method of FIG. 8. FIG. 9a shows an oxygen implant into a carrier substrate (semiconductor substrate) 510.

FIG. 9b shows a structured second oxygen implant into the carrier substrate, which is a masked oxygen implant. In this way, a laterally-varying oxygen concentration may be obtained in a surface region of the carrier substrate.

In this way, an alternating sequence of first concentration regions 914 and second concentration regions 916 distributed laterally in a direction along a surface of the semiconductor substrate may be obtained.

FIG. 9c shows an epitaxial growth of the active device volume 520 (e.g. at a thermal budget T1 of, for example, 1050° C. for 100 minutes for a 1200 V device). During the deposition of the epitaxial substrate, oxygen diffuses into the active volume according to the diffusion constant D(T) of oxygen and the solid state solubility S(T). After the epitaxial growth of the epitaxial layer 520, the oxygen diffusion region 522 may comprise an oxygen concentration $C_O(T1) \leq C_{O,1} < C_{O,2}$ for example.

FIG. 9d shows the processing of the device front side (e.g. IGBT transistor sets) including a p-body drive (e.g. at 1100° C.). After the processing of the device front side, the oxygen diffusion region 522 within the epitaxial layer 520 may comprise a laterally varying oxide concentration (e.g. $C_{O,1} < C_O(T2) \leq C_{O,2}$).

Figure 9E:
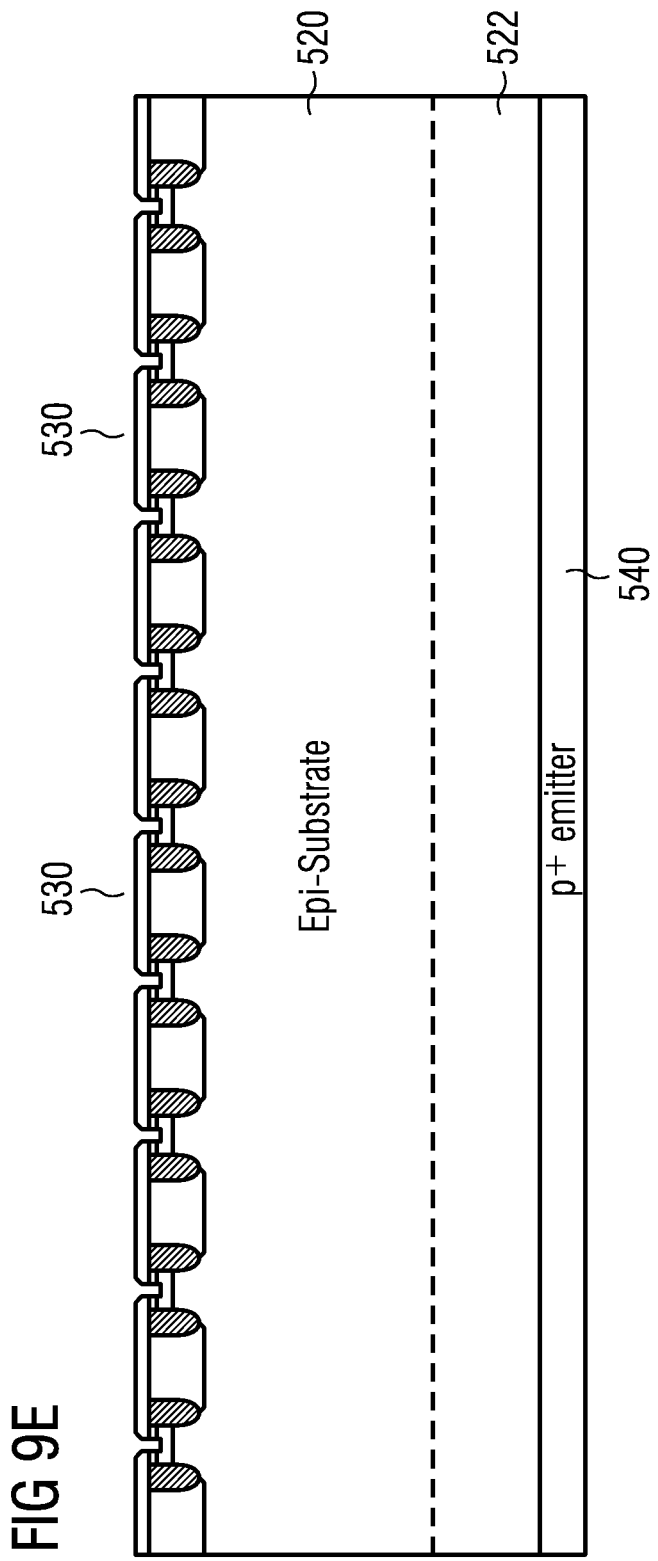

FIG. 9e shows the semiconductor device after grinding the wafer (e.g. removal of the carrier substrate) and implantation of the backside p+ emitter 540. Optionally, the thinning of the wafer is done by using CMP stop structures. Further, an activating process of the oxygen thermal donors OTD based on the controlled generated oxygen profile is performed.

The method 440 may comprise one or more additional optional acts corresponding to one or more aspect described in connection with a concept or one or more embodiments described above or below.

FIG. 10 shows a method 450 for forming a semiconductor device according to an embodiment. The method 450 is similar to the method shown in FIG. 8, but comprises additionally a further temperature process 410 (e.g. inert) at a third temperature or temperature range T3 (e.g. T1<T2<T3 or T1<T3<T2). FIG. 10 indicates a further optional act, which may be used by one or more other examples mentioned above or below.

Figure 11F:
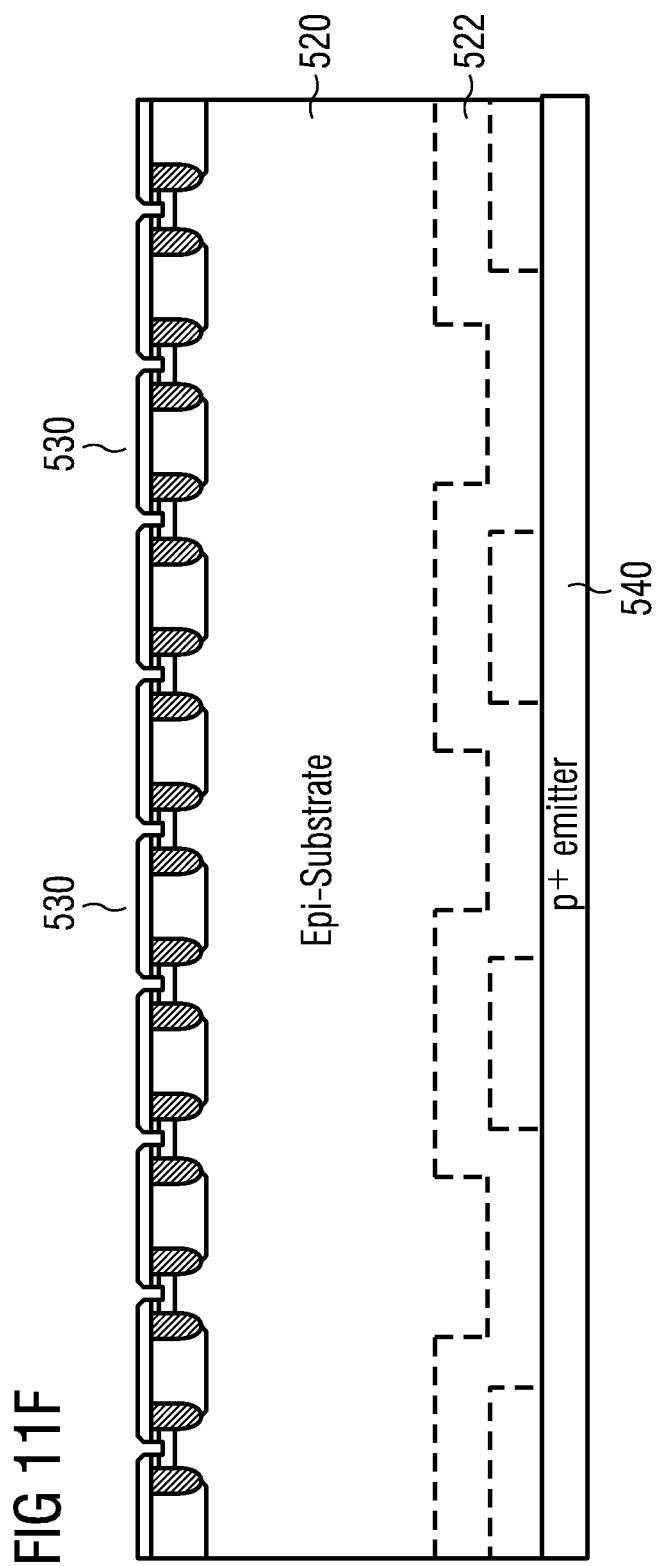

FIGS. 11a to 11f show schematic cross-sections of the forming of the semiconductor device according to the method shown in FIG. 10. FIG. 11a shows an oxygen implant into a carrier substrate (semiconductor substrate) 510.

FIG. 11b shows a structured second oxygen implant into the carrier substrate, which is a masked oxygen implant. In this way, a laterally-varying oxygen concentration may be obtained in a surface region of the carrier substrate.

FIG. 11c shows an epitaxial growth of the active device volume 520 (e.g. at a thermal budget T1 of, for example, 1050° C. for 100 minutes for a 1200 V device). During the deposition of the epitaxial substrate, oxygen diffuses into the active volume according to the diffusion constant D(T) of oxygen and the solid state solubility S(T). After the epitaxial growth of the epitaxial layer 520, the oxygen diffusion region 522 may comprise an oxygen concentration $C_O(T1) \leq C_{O,1} < C_{O,2}$ for example.

FIG. 11d shows an additional tempering at temperature or temperature range T3. The additional oxygen drive at temperature or temperature range T3 (e.g. inert) may be done subsequently to the epitaxy. For example, T1<T2<T3. Oxygen diffuses during this process according to the diffusion constant D(T) of oxygen and the solid state solubility S(T) of oxygen into the active volume. In this way, an oxygen diffusion region 522 with an oxygen concentration of $C_{O,1} < C_O(T3) \leq C_{O,2}$ may be obtained, for example.

FIG. 11e shows the processing of the device front side (e.g. IGBT transistor sets) including a p-body drive (e.g. at 1100° C.). After the processing of the device front side, the oxygen diffusion region 522 within the epitaxial layer 520 may comprise a laterally varying oxide concentration (e.g. $C_{O,1} < C_O(T2) \leq C_{O,2}$).

FIG. 11f shows the semiconductor device after grinding the wafer (e.g. removal of the carrier substrate) and implantation of the backside p+ emitter 540. Optionally, the thinning of the wafer is done by using CMP stop structures.

Further, an activating process of the oxygen thermal donors OTD based on the controlled generated oxygen profile is performed.

The method 450 may comprise one or more additional optional acts corresponding to one or more aspects mentioned in connection with a concept or one or more embodiments described above or below.

FIG. 12 shows a flowchart of a method 460 for forming a semiconductor device according to an embodiment. The method 460 is similar to the method shown in FIG. 4, but comprises additionally a hydrogen implant 480 (e.g. including optionally a thermal process for hydrogen diffusion and hydrogen thermal donor HTD elimination above, e.g., 500° C. for one hour, for example), which may be performed after the processing 416 of the device backside and before the temperature process 420 for activating the thermal donors of the oxygen. FIG. 12 indicates further optional acts, which may be used by one or more methods described above or below.

Figure 13F:
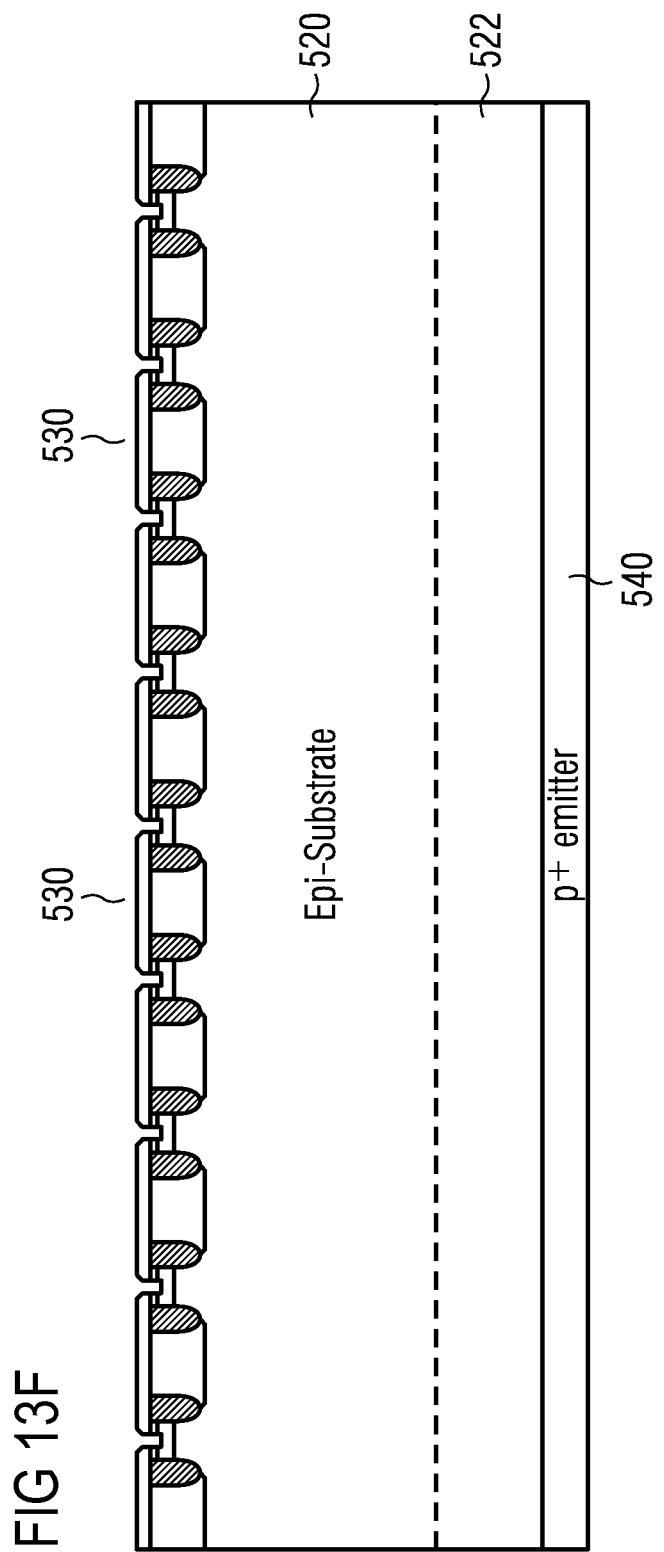

FIGS. 13a to 13f show a schematic cross-section of the forming of a semiconductor device according to the method shown in FIG. 12. FIG. 13a shows the carrier substrate 510 with an oxygen concentration $C_O$ above the maximum solid state solubility $S_O(T_{max})$ of the following process. FIG. 13b shows the epitaxial growth of the active device volume 520 (e.g. at a thermal budget T1 of 1050° C. for 100 minutes for a 1200 V device, for example). Oxygen diffuses into the active volume 520 (into the epitaxial layer or substrate) during the process corresponding the diffusion constant D(T) of oxygen and the solid state solubility S(T) of oxygen, for example.

Consequently, an oxygen diffusion region 522 is formed within the epitaxial layer 520 by oxygen diffusion from the semiconductor substrate 510 into the epitaxial substrate 520.

FIG. 13c shows the processing of the device front side (e.g. insulated gate bipolar transistor IGBT transistor cells 530) including a p-body drive T2 (e.g. at 1100° C.). The p-body drive may be a temperature process for annealing or diffusing the doping of the field-effect transistor structure (e.g. after p implant). Due to the usage of temperatures within a second temperature range T2, the oxygen diffusion region 522 expands further into the epitaxial layer 520.

FIG. 13d shows the thinning of the wafer (e.g. removal of the carrier substrate) and the implantation of the backside P emitter. Optionally, CMP stop structures may be used for the thinning, for example.

FIG. 13e shows the implant of hydrogen (e.g. including hydrogen thermal donors kill process). A buried hydrogen implant may be performed followed by an optional hydrogen diffusion act. Alternatively or additionally, an annealing act to anneal out hydrogen correlated donors (HTD) at 550° C. for one hour may be done, for example, for hydrogen doses above $10^{13}$ cm$^2$. By implanting hydrogen into the oxygen diffusion region 522, a region of increased hydrogen concentration 1324 may be obtained. This region 1324 may be expanded by a diffusion process. The hydrogen may catalyze the growth of large oxygen chains building up thermal donors, for example. Alternatively or in addition, an annealing step at 350-500° C. for 1-10 h, e.g., at 400-490° C. for 1-5 h, e.g., at 400° C. for 1-4 h may be performed to induce H-rel thermal donors, for example.

FIG. 13f shows the semiconductor device after grinding the wafer (e.g. removal of the carrier substrate) and implantation of the backside p+ emitter 540. Optionally, the thinning of the wafer is done by using CMP stop structures.

Further, an activating process of the oxygen thermal donors OTD based on the controlled generated oxygen profile is performed.

The method 460 may comprise one or more additional optional acts corresponding to one or more aspects described in connection with a concept or one or more embodiments described above or below.

FIG. 14 shows a flowchart of a method 470 according to an embodiment. The method 470 comprises a combination of process acts of the methods described in connection with FIGS. 1 to 13f.

Details regarding the different processes of the method 470 are described in connection with embodiments above or below.

Some embodiments relate to a semiconductor diode device (e.g. silicon diode or silicon carbide diode) or a semiconductor field effect transistor device (e.g. reverse-blocking or reverse-conduction insulated gate bipolar transistor) or a method for forming a semiconductor diode device or a semiconductor field effect transistor device. In other words, a semiconductor device according to the described concept or one more embodiments described above may implement a semiconductor diode device or a semiconductor field effect transistor device, for example.

The oxygen diffusion region of the epitaxial layer may form a field stop region of an insulated gate bipolar transistor (e.g. layer between a backside emitter and a drift region), for example.

Some embodiments relate to a power semiconductor device. In other words, a semiconductor device according to the described concept or one or more embodiments described above may comprise a blocking voltage of more than 100 V (e.g. between 100 V and 10000 V or more than 500 V, more than 1000 V or more than 4000 V).

Some embodiments relate to an oxygen induced field stop zone. The proposed concept may enable generating cost efficient field stops for IGBTs, power MOSFETs (metal-oxide-semiconductor-field-effect-transistor) and diodes with high reproducibility.

For example, a high penetration depth may be obtained by using oxygen. In comparison, by using donors as phosphor or selenium, the penetration depth (especially for phosphor) may be limited due to the low diffusion constant. Further, the compatibility with thin wafer processes at large wafer diameters as 8" or 12" may be problematic (for phosphor or selenium). A temperature below 500° C. may be sufficient for a doping with protons, for example.

The generation of a defined field stop zone is proposed by diffusing of oxygen during the epitaxial growth from the carrier substrate into the resulting semiconductor epitaxial layer and by a following suitable tempering generating thermal donors.

A proposed method may enable a very accurate adjustment of the oxygen concentration by the oxygen diffusion, if the oxygen concentration of the used carrier substrate is above the solid state solubility at the used process temperature during the epitaxial growth and/or the following high temperature processes (e.g. body drive). The solid state solubility is shown in FIG. 19, for example. The temperature depending solid state solubility of oxygen may determine the resulting oxygen concentration within the semiconductor device after the epitaxial growth, wherein the resulting accuracy may depend on the accuracy of the oven processes (only), for example.

Figure 17A:
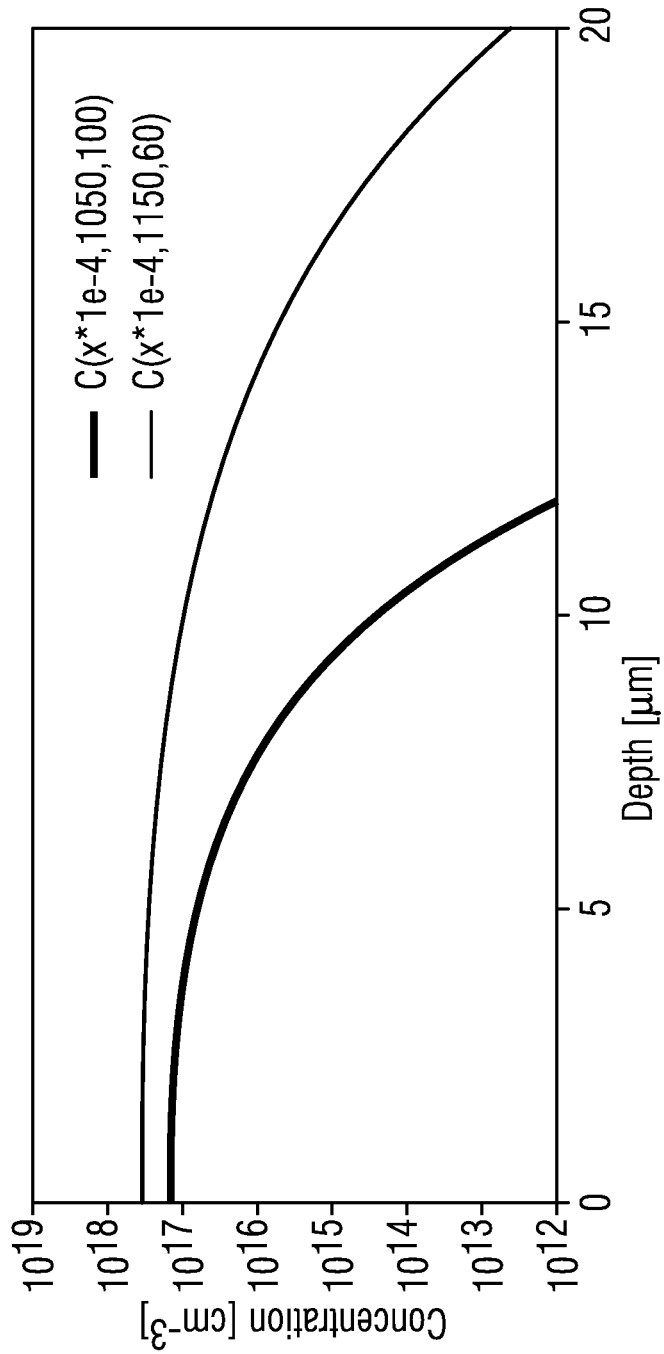
FIG. 17a shows a diffusion profile of oxygen at 1050° C. for 100 minutes and 1150° for 60 minutes with the interface to the carrier substrate at 0 μm.

The level of the oxygen concentration of the substrate may be larger than the level of the desired doping within the epitaxial layer so that a desired high reproducibility may be obtained. For this, CZ wafers (Czochralski process) with an oxygen concentration above $10^{18}$ cm$^{-3}$ or alternatively also an MCZ wafer (magnetic field Czochralski process) with sufficient oxygen doping may be suitable. Further, carrier substrates with lower oxygen concentrations as that suggested by FIG. 19 may be used after a high dose oxygen implant into the carrier substrate before the epitaxial growth process. The level of the doping may be controlled through the temperature for the epitaxy deposition and also the following high temperature acts, for example. FIG. 17a shows an example for two oxygen profiles within the later active volume of the device formed in this way. By using a suitable variation of process temperatures and process times, not only basic oxygen doping profiles can be adjusted or formed, which may run substantially according to a complementary error function, but also multi-level profiles with different doping levels and vertical doping gradients due to a selection of different process temperatures may be enabled. For example, two-stage profiles, which may result in a good softness of the switch-off and an improved short circuit strength, may be implemented with the proposed method, for example, by a diffusion at a temperature T1 followed by a diffusion at a temperature T2, wherein T1 is lower than T2.

Figure 17B:
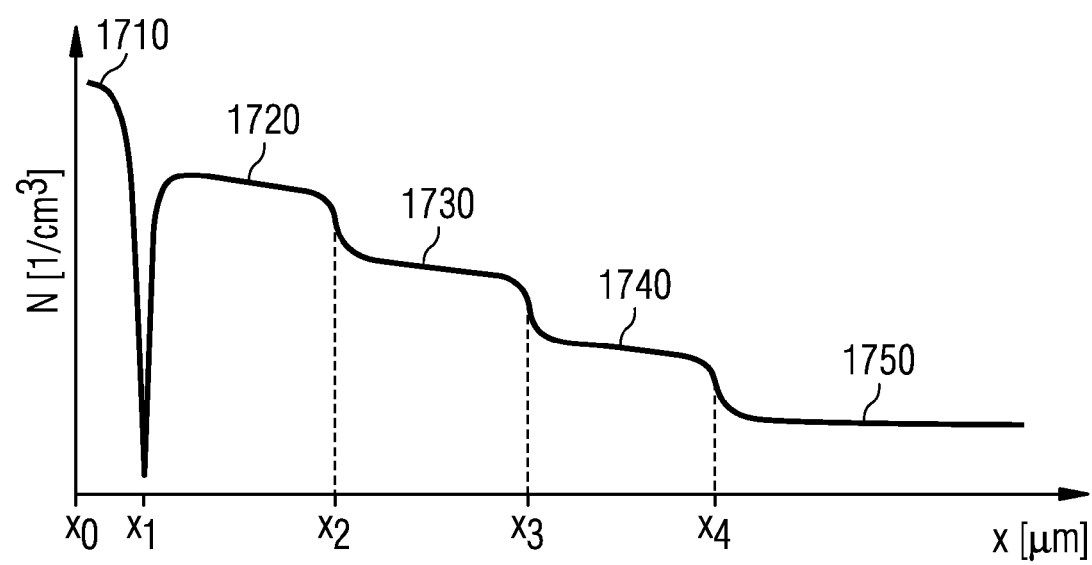
FIG. 17b shows another schematic diffusion profile of oxygen.

FIG. 17b shows a schematic doping profile of a backside of an insulated gate bipolar transistor device. A p-emitter region 1710 reaches from a backside surface $x_0$ of the semiconductor substrate to a first border $x_1$ to the oxygen diffusion region. The oxygen diffusion region extends from the border $x_1$ towards the emitter to a border $x_4$ towards the drift region 1750 of the IGBT with homogenous drift zone doping. The oxygen diffusion region comprises a first part 1720 from $x_1$ to $x_2$ with a first oxygen concentration, a second part 1730 from $x_2$ to $x_3$ with a second oxygen concentration and a third part 1730 from $x_3$ to $x_4$ with a third oxygen concentration. The diffusion region implements a 3-step field stop zone induced by oxygen induced thermal donors.

Each annealing step results in different oxygen solubility limits, if the annealing temperatures are different, for example. Therefore, the resulting oxygen-induced thermal donor profile may exhibit several graded steps. For example, for the case of three different annealing temperatures a 3-step thermal doping profile may result.

The doping profiles resulting from the oxygen doping profiles adjusted in this way may be adjusted by a temperature process afterwards, which is suitable to generate thermal donors. For this, temperatures in the range of 400° C. and 480° C. may be suitable. A good or maximal doping efficiency may be obtained at about 450° C., for example. The annealing time (tempering time) may be in the range of 30 minutes to 20 hours or in the range of 1 hour and 10 hours, for example.

Depending on the used temperature range, also thermal double donors (oxygen thermal double donor, OTDD) may be generated. OTDD may comprise an additional deep donor level below 150 meV beside a flat donor level at substantially 50 meV, for example. The ionization degree of OTDD field stops may increase with increasing device temperature due to the comparatively high ionization energy of the deep level. In this way, the emitter efficiency of the device may be varied in dependency on the temperature. Therefore, a reduction of the hot leakage current and an improvement of the softness of the switch-off act may be achieved.

The generation of a donor-like field stop profile by a diffusion of oxygen from an oxygen doped substrate is proposed, wherein the oxygen doping of the substrate is higher than the level of the desired oxygen doping in the epitaxial layer, for example. Examples of proposed methods are shown in FIGS. 1 to 13f.

For example, a process for generating two-stage oxygen profiles is proposed for which two leading temperature processes at two temperatures T1 and T2 may be used. The process at temperature T1 may be performed before the process at temperature T2 and T1 may be lower than T2. Optionally, the epitaxial growth may be interrupted for insertion of the process T2, for example. Optionally, the epitaxy may be interrupted and a tempering at 1200° C. may be performed in order to get independent or more independent from the thermal budget. Optionally, a high dose oxygen implant into the carrier substrate may be performed before the growth of the later device substrate. The implanted dose may be selected so that the surface concentration within the carrier (e.g. considering also the following overall thermal budget) is above the highest solid state solubility during the following processes independent from the initial concentration, for example.

The field stop may be structured (e.g. stepped field stop possible) before the growth of the actual epitaxial (epi) layer by a structured oxygen O implant into the carrier substrate, if a carrier substrate with an oxygen O concentration below the solubility (e.g. alternatively also an oxygen O poor first epi layer) is used. Further, a laterally structured oxygen concentration in the carrier substrate may be combined with a two-stage process described above, wherein the oxygen concentration O1 in first regions is in the range of the solubility at T1, at least below T2, and the oxygen concentration O2 is in second regions at least above the solubility at T2, for example. A desired lateral variation of the back side partial transistor gain factor of IGBTs or thyristors may be adjusted due to this measure in order to improve the softness of the switch-off. Optionally, an implementation of the so called HDR (high dynamic robustness) principles may be enabled by implementing an increased field stop concentration in the region of the edge termination, which may result in a reduced floating with free charge carriers of the edge region in an on-state. For example, the method described above uses a high dose oxygen implant or plasma deposition into the carrier substrate, wherein the dose is selected depending on a previously measured initial concentration within the carrier substrate in order to enable a good controllable process independent from the oxygen concentration of the starting substrate.

Optionally, an additional hydrogen implant (e.g. with low implant energy) into the backside of the device following a thinning process may be performed. In this way, the diffusion barrier of the oxygen may be significantly reduced (directly) before the activation of the thermal donors, but after the diffusion of the oxygen to the desired profile shape of the field stop, for example. In this way, the thermal budget required for the activation of the field stop may be significantly reduced, for example.

The implementation of a proposed oxygen diffusion region may be detectable by a doping profile analysis (e.g. spreading resistance analysis, Deep-level transient spectroscopy (DLTS), infrared spectroscopy or photo luminescence).

FIG. 15 shows a schematic cross section of a semiconductor device 1500 according to an embodiment. The semiconductor device 1500 comprises an epitaxial substrate 1510, a plurality of transistor structures or diode structures 1520 located at a front side of the epitaxial substrate 1510 and a donor region 1530 located at a backside of the epitaxial substrate 1510. The donor region 1530 comprises more than $1 \times 10^{14}$ oxygen induced thermal donors per cm$^3$ (or more than $3 \times 10^{14}$ oxygen induced thermal donors per $cm^3$, more than $1 \times 10^{15}$ oxygen induced thermal donors per $cm^3$, more than $1 \times 10^{16}$ oxygen induced thermal donors per $cm^3$ or more than $1 \times 10^{17}$ induced thermal donors atoms per $cm^3$) having a donor energy level between 30 meV and 200 meV.

The donor region may implement a region of increased thermal donors. In this way, the softness of the switching of semiconductor devices (e.g. insulated gate bipolar transistor or diode) may be improved. A semiconductor device with improved softness may comprise an increased durability or life cycle, for example.

The concentration of oxygen atoms per $cm^3$ within the donor region 1530 may be more than 10 times higher than the oxygen induced thermal donor concentration, for example. Further, also a region neighboring the donor region 1530 may comprise some oxygen induced thermal donors with a concentration decreasing with increasing distance from the donor region 1530.

More details are described in connection with one or more embodiments described above (e.g. epitaxial substrate, transistor structures or oxygen diffusion region representing a donor region). The semiconductor device 1500 may comprise one or more additional features corresponding to one or more aspects described in connection with a proposed concept or one or more embodiments described above (e.g. FIGS. 1 to 14).

According to an example, a semiconductor device may comprise an epitaxial substrate, a plurality of transistor structures located at a front side of the epitaxial substrate and a donor region located at a backside of the epitaxial substrate 1510. The donor region 1530 comprises more than $1 \times 10^{17}$ oxygen atoms per $cm^3$ (or more than $1 \times 10^{18}$ oxygen atoms per $cm^3$) having a donor energy level between 30 meV and 200 meV.

More details are described in connection with one or more embodiments described above (e.g. epitaxial substrate, transistor structures or oxygen diffusion region representing a donor region). The semiconductor device may comprise one or more additional features corresponding to one or more aspects described in connection with a proposed concept or one or more embodiments described above (e.g. FIGS. 1 to 14).

FIG. 16 shows a schematic cross section of a semiconductor device 1600 according to an embodiment. The semiconductor device 1600 comprises an epitaxial substrate 1610 with a donor region 1620. The donor region 1620 comprises a laterally varying oxygen concentration.

The donor region may implement a region of increased thermal donor concentration. In this way, the softness of the switching of semiconductor devices (e.g. insulated gate bipolar transistor or diode) may be improved. A semiconductor device with improved softness may comprise an increased durability or life cycle, for example.

An example of a lateral course 1630 of an oxygen concentration $C_{Ox}$ in one direction x along a surface of the epitaxial substrate 1610 is also shown in FIG. 16.

More details are described in connection with one or more embodiments described above (e.g. epitaxial substrate, oxygen diffusion region representing a donor region or a lateral variation of the oxygen concentration). The semiconductor device 1600 may comprise one or more additional features corresponding to one or more aspects described in connection with a proposed concept or one or more embodiments described above (e.g. FIGS. 1 to 14).

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
    depositing an epitaxial layer on a semiconductor substrate;
    forming an oxygen diffusion region within a lower portion of the epitaxial layer that directly adjoins the semiconductor substrate by oxygen diffusion from the semiconductor substrate into a part of the epitaxial layer;
    tempering at least the oxygen diffusion region of the epitaxial layer at a temperature between 400° C. and 480° C. for more than 15 minutes; and
    forming transistor structures at an upper surface of the epitaxial layer such that doped regions of the transistor structures extend from the upper surface into the epitaxial layer, the upper surface being spaced apart from the oxygen diffusion region by an upper portion of the epitaxial layer, and wherein the oxygen diffusion region has a higher oxygen concentration than the upper portion of the epitaxial layer,
    wherein the transistor structures are insulated gate bipolar transistor structures.

2. The method of claim 1, further comprising implanting hydrogen into the oxygen diffusion region of the epitaxial layer.

3. The method of claim 2, further comprising tempering at least the oxygen diffusion region of the epitaxial layer at a temperature between 500° C. and 600° C. for more than 15 minutes after the hydrogen implant.

4. The method of claim 1, further comprising implanting oxygen into the semiconductor substrate.

5. The method of claim 4, further comprising forming an implant mask on a surface of the semiconductor substrate for masking the oxygen implant at a part of the surface of the semiconductor substrate.

6. The method of claim 4, further comprising measuring an oxygen concentration of the semiconductor substrate before the oxygen implant.

7. The method of claim 1, wherein the tempering of at least the oxygen diffusion region of the epitaxial layer is done at a temperature between 420° C. and 470° C. for more than 2 hours and less than 20 hours.

8. The method of claim 1, wherein depositing the epitaxial layer on the semiconductor substrate is at least partly done at a first temperature range above 1000° C. causing at least a part of the oxygen diffusion from the semiconductor substrate into the part of the epitaxial layer forming the oxygen diffusion region within the epitaxial layer.

9. A method for forming a semiconductor device, the method comprising:
    implanting oxygen into a semiconductor substrate;
    depositing an epitaxial layer on the semiconductor substrate;
    forming an oxygen diffusion region within a lower portion of the epitaxial layer by oxygen diffusion from the semiconductor substrate into a part of the epitaxial layer; and
    forming transistor structures at an upper surface of the epitaxial layer such that doped regions of the transistor structures extend from the upper surface into the epitaxial layer, the upper surface being spaced apart from the oxygen diffusion region by an upper portion of the epitaxial layer, and wherein the oxygen diffusion region has a higher oxygen concentration than the upper portion of the epitaxial layer,
    wherein the transistor structures are insulated gate bipolar transistor structures.

10. The method of claim 9, further comprising implanting hydrogen into the oxygen diffusion region of the epitaxial layer.

11. The method of claim 10, further comprising tempering at least the oxygen diffusion region of the epitaxial layer at a temperature between 500° C. and 600° C. for more than 15 minutes after the hydrogen implant.

12. The method of claim 9, further comprising forming an implant mask on a surface of the semiconductor substrate for masking the oxygen implant at a part of the surface of the semiconductor substrate.

13. The method of claim 9, further comprising measuring an oxygen concentration of the semiconductor substrate before the oxygen implant.

14. The method of claim 9, wherein an oxygen concentration within at least a part of the semiconductor substrate is larger than a solid state solubility of oxygen within the epitaxial layer.

15. The method of claim 9, wherein depositing the epitaxial layer on the semiconductor substrate is at least partly done at a first temperature range above 1000° C. causing at least a part of the oxygen diffusion from the semiconductor substrate into the part of the epitaxial layer forming the oxygen diffusion region within the epitaxial layer.

16. A method for forming a semiconductor device, the method comprising:
    depositing an epitaxial layer on a semiconductor substrate;

forming an oxygen diffusion region within a lower portion of the epitaxial layer by oxygen diffusion from the semiconductor substrate into a part of the epitaxial layer;

implanting hydrogen into the oxygen diffusion region of the epitaxial layer; and forming transistor structures at an upper surface of the epitaxial layer such that doped regions of the transistor structures extend from the upper surface into the epitaxial layer, the upper surface being spaced apart from the oxygen diffusion region by an upper portion of the epitaxial layer, and wherein the oxygen diffusion region has a higher oxygen concentration than the upper portion of the epitaxial layer, wherein the transistor structures are insulated gate bipolar transistor structures.

17. The method of claim 16, further comprising tempering at least the oxygen diffusion region of the epitaxial layer at a temperature between 500° C. and 600° C. for more than 15 minutes after the hydrogen implant.

18. The method of claim 16, further comprising implanting oxygen into the semiconductor substrate.

19. The method of claim 18, further comprising forming an implant mask on a surface of the semiconductor substrate for masking the oxygen implant at a part of the surface of the semiconductor substrate.

20. The method of claim 18, further comprising measuring an oxygen concentration of the semiconductor substrate before the oxygen implant.

21. The method of claim 16, wherein depositing the epitaxial layer on the semiconductor substrate is at least partly done at a first temperature range above 1000° C. causing at least a part of the oxygen diffusion from the semiconductor substrate into the part of the epitaxial layer forming the oxygen diffusion region within the epitaxial layer.

* * * * *